(12) United States Patent
Kimura et al.

(10) Patent No.: US 6,654,399 B1
(45) Date of Patent: Nov. 25, 2003

(54) SEMICONDUCTOR LIGHT PROJECTION APPARATUS AND DISTANCE MEASUREMENT APPARATUS

(75) Inventors: Yuji Kimura, Nagoya (JP); Katsunori Abe, Aichi-ken (JP); Kinya Atsumi, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/511,778

(22) Filed: Feb. 23, 2000

(30) Foreign Application Priority Data

Feb. 24, 1999 (JP) .......................... 11-046560
Jan. 7, 2000 (JP) ........................ 2000-001429

(51) Int. Cl.$^7$ ................................ H01S 5/00
(52) U.S. Cl. .................. 372/50; 372/43; 372/46; 257/80; 257/84; 257/432; 362/234; 362/252; 362/235; 362/232; 359/387; 359/613; 359/656; 359/19; 359/20
(58) Field of Search ................. 372/50, 38.01, 372/38.04, 38.02, 43, 46, 35, 34, 36; 257/80, 84, 432; 362/234, 252, 235, 237; 356/5.01; 359/387, 613, 656, 19–20

(56) References Cited

U.S. PATENT DOCUMENTS

| | | | | |
|---|---|---|---|---|
| 4,748,469 A | * | 5/1988 | Tamura ..................... 250/201.4 |
| 5,130,531 A | * | 7/1992 | Ito et al. ...................... 250/216 |
| 5,559,819 A | | 9/1996 | Abe et al. |
| 5,623,509 A | | 4/1997 | Iwano et al. |
| 5,838,703 A | * | 11/1998 | Lebby et al. ................ 372/101 |
| 5,887,012 A | | 3/1999 | Yamada |
| 6,046,065 A | * | 4/2000 | Goldstein et al. ............. 438/46 |
| 6,240,116 B1 | * | 5/2001 | Lang et al. .................. 372/108 |
| 2002/0075920 A1 | * | 6/2002 | Spruytte et al. ............... 372/45 |
| 2002/0075930 A1 | * | 6/2002 | Hirata .......................... 372/50 |

FOREIGN PATENT DOCUMENTS

| | | |
|---|---|---|
| JP | 5-41561 | 2/1993 |
| JP | 6-283806 | 10/1994 |
| JP | 6-283807 | 10/1994 |
| JP | 7-147463 | 6/1995 |
| JP | 7-307520 | 11/1995 |
| JP | 9-167878 | 6/1997 |

* cited by examiner

Primary Examiner—Paul Ip
Assistant Examiner—Delma R. Flores-Ruiz
(74) Attorney, Agent, or Firm—Posz & Bethards, PLC

(57) ABSTRACT

In performing an light emitting operation using a plurality of semiconductor light-emitting devices, these semiconductor light-emitting devices are lighted up such that the driving current is lessened and the life time of the devices is prevented from being shortened and lights can be emitted to a remote site without reducing an amount of lights. Semiconductor laser devices $23a$ to $23c$, which emit lights through independent lenses $25a$ to $25c$, are connected in series to each other and connected to a signal generating circuit 24, serving as a power supply, so as to perform pulse lighting, whereby making it possible to light up three semiconductor laser devices simultaneously at a driving current corresponding to one semiconductor laser device. A package of semiconductor laser devices $23a$ to $23c$ comprises three lead terminals, and an electrical connection to two lead terminals, which are electrically insulated from a metallic base, is established. If a light collection point P is positioned in the midway of the detection distance range, the shifting quantity of the laser beams is minimized over substantially the entire area so that the amount of lights can be suppressed.

19 Claims, 25 Drawing Sheets

FIG. 19A
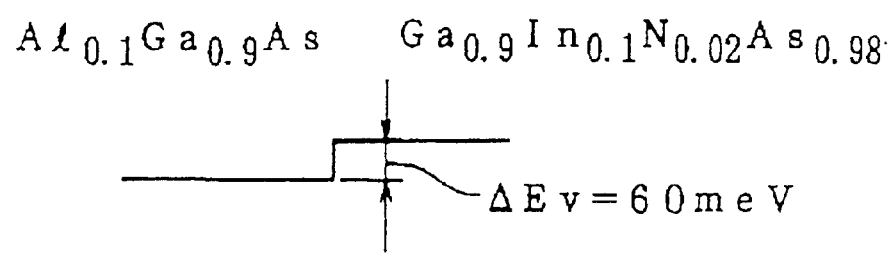
FIG. 19B
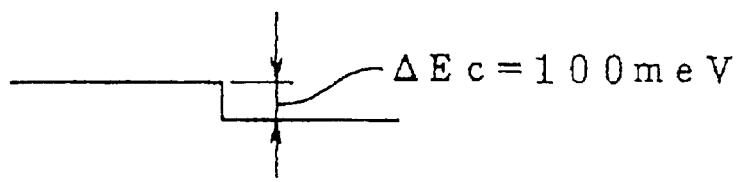
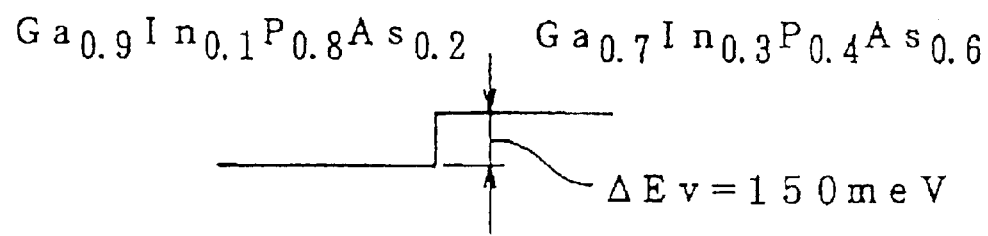

SAFE STANDARD OF LASER BEAM
WITH PULSE WIDTH OF 1 TO 100 nsec
(JIS C6802) MPE

FIG. 21

| WAVELENGTH λ (nm) | EXPOSURE TIME t (s) | | | | | | | | | LIMITING APERTURE mm |
|---|---|---|---|---|---|---|---|---|---|---|
| | $<10^{-9}$ | $10^{-9} \sim 10^{-7}$ | $10^{-7} \sim 10^{-6}$ | $10^{-6} \sim 1.8 \times 10^{-5}$ | $10^{-5} \sim 5 \times 10^{-5}$ | $5 \times 10^{-5} \sim 10$ | $10 \sim 10^3$ | $10^3 \sim 10^4$ | $10^4 \sim 3 \times 10^4$ | |
| 180~302.5 | $3 \times 10^{10}$ W·m$^{-2}$ | | | $30 J·m^{-2}$ | | | | | | 1 |
| 302.5~315 | | | | $C_1 J·m^{-2} (t<T_1)$ $C_2 J·m^{-2} (t \geq T_1)$ | | | $C_2 J·m^{-2}$ | | | |
| 315~400 | | | | $C_1 J·m^{-2}$ | | | $10^4 J·m^{-2}$ | | $10 W·m^{-2}$ | |
| 400~550 | $5 \times 10^4$ W·m$^{-2}$ | | $5 \times 10^{-3} J·m^{-2}$ | | $18 \times t^{0.75} J·m^{-2}$ | | $100 J·m^{-2}$ | $18 \times t^{0.75} J·m^{-2}$ $(t<T_2)$ $C_3 \times 10^2 J·m^{-2}$ $(t \geq T_2)$ | $10^{-2} W·m^{-2}$ $C_3 \times 10^{-2}$ W·m$^{-2}$ | 7 |
| 550~700 | | | | | | | | | | |
| 700~1050 | $5 \times C_4 \times 10^6$ W·m$^{-2}$ | | $5 \times C_4 \times 10^{-3} J·m^{-2}$ | | $18 \times C_4 \times t^{0.75} J·m^{-2}$ | | | $3.2 \times C_4 W·m^{-2}$ | | |
| 1050~1400 | $5 \times 10^7$ W·m$^{-2}$ | | | $5 \times 10^{-2} J·m^{-2}$ | | $90 \times t^{0.75} J·m^{-2}$ | | $16 W·m^{-2}$ | | |
| 1400~1530 | $10^{11}$ W·m$^{-2}$ | $100 J·m^{-2}$ | | $5600 \times t^{0.25} J·m^{-2}$ | | | $1000 W·m^{-2}$ | | | 1 |
| 1530~1550 | | $1.0 \times 10^4 J·m^{-2}$ | | $5600 \times t^{0.25} J·m^{-2}$ | | | | | | |
| 1550~10$^5$ | | $100 J·m^{-2}$ | | $5600 \times t^{0.25} J·m^{-2}$ | | | | | | |
| $10^3 \sim 10^4$ | | | | | | | | | | 11 |

PROJECTION DISTANCE

SEMICONDUCTOR LIGHT PROJECTION APPARATUS AND DISTANCE MEASUREMENT APPARATUS

BACKGROUND OF THE INVENTION

1. Field of the Invention

The present invention relates to a semiconductor light projection apparatus which comprises an optical system for projecting lights emitted from a plurality of semiconductor light emitting devices onto a light projected area, and a distance measurement apparatus which comprises the semiconductor light projection apparatus and receives reflected light from an object to detect a distance from the object.

2. Description of the Related Art

A distance measurement apparatus has been developed, which projects light to a detected area from a semiconductor light projection apparatus built therein, constituted by semiconductor light emitting devices such as a semiconductor laser device and a light emitting diode, and receives the reflected light to measure a distance from a measured object in the detected area based on a delay time.

The distance measurement apparatus is used for a system which measures a distance between a certain automobile loading this apparatus and another automobile and gives an alarm when the distance between the automobiles becomes smaller than a predetermined value, and for a system which measures a distance from the certain automobile to another automobile or an obstacle during parking and gives the alarm when the distance therebetween is smaller than a predetermined value. The distance measurement apparatus is used also for a system which gives the alarm when light is intercepted at a range within a predetermined distance in a light projected area.

Furthermore, a system is devised, which controls a running of the automobile and facilitates the safe and proper running of the automobile by utilizing these systems.

In this case, considering also running conditions on a superhighway, the inter-automobile distance measurement system is required to be capable of measuring the distance between the automobile and another automobile running in front, which ranges from about 10 m to about 100 m or more, for example, about 120 m. To cope with this requirement, the semiconductor laser devices must be driven so as to perform laser oscillation at pulses of several tens to several hundreds nsec and emit light exhibiting power of about 20 W to about 80 W in total. In general, one semiconductor laser device can emit light exhibiting power of about 10 W to about 20 W when a peak current is set to about 20A. Accordingly, in order to meet above described requirement, it is conceived that one semiconductor laser device is driven with a large current or alternatively a plurality of semiconductor laser devices are simultaneously driven and light outputs from them are synthesized.

Since a life time of the semiconductor laser device lowers in reverse proportion to a magnitude of current, to drive one semiconductor laser device with a large current is not said to be a good condition for the device. Accordingly, a method which allow a plurality of semiconductor laser devices to perform laser oscillations and collect lights emitted from them to achieve a large amount of lights will be available.

As this method, a method which allows the semiconductor laser devices to emit lights by driving the semiconductor laser devices individually, each being coupled in parallel to a light source, and collects these lights is conceived.

However, when this method is adopted, driving currents of the number equal to that of the semiconductor laser devices coupled in parallel to the light source must be made to flow therethrough, so that a quantity of power consumption becomes large and sharpness of waveforms of pulses is lost. Accordingly, this method is not very desirable in terms of driving conditions.

On the other hand, to solve such drawbacks, there have been methods, which are disclosed in Japanese Patent Applications Laid-Open Nos. 5-41561, 6-282807 and 7-307520. In these methods, a plurality of semiconductor laser devices are laminated so as to be integrated with each other and they are driven in the state where they are in series coupled to each other, and a plurality of light emission points as a light source are arranged at intervals of about 100 $\mu$m. The lights from the light emission points are collected by a collection lens and converted to a parallel light, and the parallel light is projected onto a projected area.

In this case, even when the interval between the light emission points in the light source is 100 $\mu$m, intervals between spots of laser beams from the semiconductor laser devices spread in proportion to a projection distance. As shown in FIG. 25, for example, a semiconductor laser apparatus 1 constituted by stacking three semiconductor laser devices 1a to 1c is disposed at a focal position of a collection lens 2 as an optical system, and the semiconductor laser apparatus 1 is allowed to emit light. Laser beams emitted from light emitting points La to Lc of the corresponding laser devices 1a to 1c are collected after passing through the collection lens 2, and converted to parallel lights Sa to Sc.

At this time, when a diameter of each spot of the parallel lights Sa to Sc is D, a shift equal to that the interval of the arrangement of the laser devices 1a to 1c is created at a position distant from the devices 1a to 1c by a focal length f. Since a spot diameter becomes large to some degree practically, such shift is not a problem, and a state that the lights are collected is kept. When such parallel lights Sa to Sc travel by a distance to be objected, for example, by about several ten meters, the above described shift is widened to a degree that cannot be neglected. Thus, effects that the detection distance is lengthened is entirely lost by collecting the lights.

This state is illustrated in FIG. 26. Specifically, if it is intended to lengthen the detection distance X, lights are projected so as to overlap spots when the detection distance is about X1. When the detection distance is lengthened to about X2 larger than X1, not only a reduction of a quantity of light is brought about, but also formation of a dark area B where light is not projected is created by enlarging a distance between the spots. In this case, a measured object positioned in the dark area B accidentally in measuring the distance is not measured, so that the measured object is recognized as that no object exists. A disadvantage that a precise measurement can not be performed is brought about.

A degree of the spread of the interval between the spots is in proportion to a distance from the collection lens 2, and as the distance from the collection lens 2 becomes larger, the spread of the interval between the spots becomes larger simply. Thus, a reduction of a quantity of light and occurrence of the dark area becomes remarkable, and this is a disadvantageous condition when it is intended to receive much reflection light from the object.

The reduction of a quantity of the reflection light is estimated in the following manner. When the distance between the light emission points La to Lc is assumed to be 100 μm, a spread angle θ of the light source with respect to the focal length f of the collection lens 2 is expressed by the following formula.

$$\theta = \arctan(0.1/f)$$

If the focal length f is 22 mm, the spread angle θ becomes 0.26°. In a position apart from the position of the collection lens 2 by 22 mm that is 1000 times as long as the focal length f, a distance between centers of the spots is about 10 cm. Since the position of the center of the spot is sure to be shifted even when the spot diameter D is considered, a quantity of light per unit area reduces owing to the spread of light in the projected area. Accordingly, a quantity of light is surely reduced.

Therefore, when it is intended to set a distance of 100 m or more as a range of a measured distance, a quantity of light significantly and also a dark area occurs. It is necessary to take a countermeasure to increase the quantity of light by driving the semiconductor laser with large current. In this case, lowering of a life time of the semiconductor laser cannot be prevented.

Furthermore, a constitution in which a range of the measured distance is set to a remote distance of 100 mm or more is obtained, a strong light is emitted. When such strong light is to be emitted, an emission level of the light must be set under consideration of safety in using the apparatus in circumstances where such strong light is incident onto eyes of human being. Also in this point, a technological subject for a high emission of light is left.

SUMMARY OF THE INVENTION

The present invention was made in view of the above described circumstances, the object of the present invention is to provide a light projection apparatus which is constituted by using a plurality of semiconductor light emitting devices, which is capable of emitting light of a high intensity with small current, and performing an effective projection operation in accordance with a projection distance, and to provide a distance measurement apparatus which is capable of effectively performing a distance measurement using the semiconductor light projection apparatus.

Another object of the present invention is to provide a semiconductor light projection apparatus which is capable of securing safety for eyes of human being in using the apparatus under circumstance where strong light may be incident onto the eyes when the apparatus must project the strong light onto a remote position to achieve the foregoing object, and to provide a distance measurement apparatus which measures a measurement distance using the semiconductor light projection apparatus.

According to one aspect of the present invention, since a plurality of optical devices are disposed for corresponding semiconductor light emitting devices so as to project light onto a light projected area and the plurality of light emitting devices are in series connected to a power source so as to be supplied with a power, current equal to that to be supplied to one semiconductor light emitting device is supplied to all of the light emitting devices, so as to allow the light emitting devices to perform light emitting operations. Thus, a quantity of light equal to that emitted by all of the semiconductor light emitting devices connected in series can be obtained.

Specifically, in the semiconductor light emitting device, light emitting phenomenon occurs by allowing current to flow therethrough in a certain direction. Accordingly, when the semiconductor light emitting devices are in series connected to each other, all of the semiconductor light emitting devices emit lights. At this time, as in the first aspect of the present invention, a light emitting diode device, a semiconductor laser device, an electroluminescence device (EL device) and the like do exert almost no resistance, so that all of devices connected in series emit lights. Thus, an intensity of light emission equal to that emitted by the devices of the number can be obtained by supply of current equal to be supplied to one device.

Since the light obtained from each semiconductor light emitting device can be projected to the light projected area by the individual optical device, by collecting the lights emitted from the semiconductor light emitting devices without separating them the collected lights with a high intensity can be projected onto one spot. Alternatively, it is possible to perform the projection operation for the corresponding light projected areas, individually.

According to another aspect of the present invention, in the semiconductor light projection apparatus adopting the above described constitution, with reference to a package accommodating a semiconductor device of the semiconductor light emitting device by loading it thereon, the semiconductor device is fixed to the package by fixing a metallic pedestal onto a metallic base, using a metallic base and an ordinarily case having three terminals including a terminal electrically conducting to the metallic base. The semiconductor device can be accommodated within the package without using another package exclusively used. In this case, by bonding other two terminals formed so as to be insulated from the metallic base and both electrodes of the semiconductor device to each other, a constitution drawing out the terminals suitable for connecting the light emitting device in series can be obtained.

The terminal electrically conducting to the metallic base can be kept at a predetermined potential which has no relation with an operation of the semiconductor device. In other words, the terminal is connected to, for example, the ground terminal, a potential of the whole of the package is kept a stable state, and the semiconductor devices of the semiconductor light emitting devices can be made to be a state where they are connected in series to each other. Moreover, even when a heat radiation fin is fitted to the whole of the package, an electrical insulation from the semiconductor device is established. Handling for heat radiation is made to be easy, and a stable operation can be achieved.

According to another aspect of the present invention, in the above described package, the metallic pedestal is provided so as to be insulated from the metallic base, and the semiconductor device is loaded onto the metallic pedestal so that its rear surface electrode is made to be electrically conduct to the metallic pedestal, and fixed to the metallic pedestal. Moreover, the surface electrode and the metallic pedestal are connected to the two terminals which do not electrically conduct to the metallic base by bonding wires. Thus, the semiconductor device can be provided so as to electrically conduct to the metallic pedestal, and an electric connection with the rear surface electrode of the semiconductor device can be achieved interposing the metallic pedestal, so that assemble operations can be simplified.

According to still another aspect of the present invention, in the package constituted as above, the semiconductor device is loaded on the metallic pedestal in a state where a conductor pattern electrically conducting to the rear surface electrode is interposed between the semiconductor and the metallic pedestal as well as in the semiconductor device is electrically insulated from the metallic pedestal, and fixed to the metallic pedestal. The surface electrode and the conductor pattern are connected to the two terminals which do not electrically conduct to the metallic base by bonding wires. The rear surface of the semiconductor device and the metallic base are made to be in an insulated state, without depending on whether or not an insulation state between the metallic base and the metallic pedestal is created. In addition, an electrical connection with the rear surface of the semiconductor device interposing the conductor pattern therebetween can be achieved. Limitations in fixing the metallic pedestal to the metallic base are lessened, thus simplifying the steps.

According to still further aspect of the present invention, in the above described constitution, since the semiconductor device is loaded interposing an insulating plate on a surface of which a conductor pattern is formed and fixed thereto, another conductor pattern needs not to be provided newly, thus simplifying the constitution and reducing the number of assembly steps.

According to still another aspect of the present invention, in a semiconductor light projection apparatus adopting a semiconductor light emitting device that is a current-driven type two terminal device, the package which loads the semiconductor device to accommodate it is a package exclusively used for a certain purpose, which is constituted by a metallic base, a metallic pedestal fixed to the metallic base in a state insulated from the metallic base, and two terminals, so that a fabrication is simplified. Although a terminal electrically conducted to the metallic base is not provided, when a contact with a potential of a portion fixing the package is made, the ground potential is, so that a stability is established, and it is possible to prevent to give an adverse effect to the semiconductor device.

According to still another aspect of the present invention, in the semiconductor light projection apparatus adopting a semiconductor light emitting device that is a current-driven type two terminal device, the semiconductor device is formed to a mesa shape, and an electrode is formed on its step difference portion and a surface portion, whereby an electrode structure in which a current supply from the same surface side is performed is obtained. The package is constituted by a case including a metallic base and three terminal including a terminal electrically conducting to the metallic base, and a metallic pedestal for bonding the semiconductor device, the metallic pedestal being fixed onto the metallic base. The semiconductor device is constructed such that the electrodes on the step difference portion and the surface portion and the two terminals which do not electrically conduct to the metallic base are connected by bonding wires, respectively. Any of the bonding wires is connected to the front surface of the semiconductor device without depending on the electrode of the package and the terminal structure, thus simplifying the fabrication steps.

According to still another aspect of the present invention, in the semiconductor light projection apparatus adopting a semiconductor light emitting device that is a current-driven type two terminal device, the package constituting the semiconductor light emitting device providing a plurality of semiconductor devices therein so as to be integrated with each other is constituted by at least two terminals provided so as to correspond to both terminals when metallic pedestals for device bonding and the plurality of semiconductor devices are in series connected, the metallic pedestals corresponding to the number of the metallic bases and the semiconductor devices. The plurality of semiconductor devices are in series connected by bonding wires in a state where the plurality of semiconductor devices are bonded on the metallic pedestals so as to be fixed thereto. Thus, the plurality of semiconductor devices can be provided in one package integrally therewith in a state where they are in series connected to each other. The apparatus is compacted, and handing of it is simplified. Moreover, since the semiconductor devices are bonded at approximately certain points, adjustment for the optical system is comparatively simplified.

According to still another aspect of the present invention, in the above described constitution, since a cover formed integrally with a lens as an optical system corresponding to a light projections of each of a plurality of semiconductor light emitting devices is provided, handing is more simplified. By previously performing an adjustment of the lens, the adjustment of the optical system needs not to be further performed, thus achieving a significant reduction of the number of the fabrication steps.

According to still further another aspect of the present invention, in the semiconductor light projection apparatus using the package in the above described constitutions, since at least two bonding wires are provided for each connection portion of the semiconductor device, the semiconductor light projection apparatus can be used without reducing a reliability of an operation in spite of the constitution in which the plurality of semiconductor light emitting devices are in series connected. For example, in the case of malfunction due to breaking of any of t he bonding wires, an electrical conduction can be kept through remaining bonding wires. As troubles expected to occur in the semiconductor light emitting device, short-circuiting trouble occurs generally. In this case, since current supplies to other semiconductor light emitting devices can be kept, it is possible to keep the light projection state as a whole.

According to still another aspect of the present invention, in the above described semiconductor light emitting apparatuses, since a semiconductor laser device is used as the semiconductor device, a light projection operation with a higher efficiency can be performed by performing spotting for light by an optical system as a light source, so that the light projection which projects light with a high density to a remote distance can be performed. Laser beams from the semiconductor laser devices can be collected, thus further increasing its efficiency.

According to still another aspect of the present invention, since the semiconductor device emitting light a wavelength of which is set to 1.4 $\mu$m or more is used, the wavelength of the light i s included within an eye safe region of a safety standard MPE (Maximum Permissible Exposure) defined in JIS (C6802) in case of performing pulse lighting. Even when strong light is irradiated onto a remote position under circumstances where the light may be incident onto eyes of human beings, the light can be projected safely without giving bad influence to the human body. In other words, it is possible to emit light with a high power without any limitation to an output which is limited in the wavelength of 1.4 $\mu$m or less.

According to still further another aspect of the present invention, in the above described semiconductor light projection apparatuses, since a plurality of optical devices are constituted to a state where optical axes thereof are adjusted so as to collect lights emitted from the plurality of semiconductor light emitting devices to project collected light onto one projected area, the light projection can be performed with a high light density even when the light is projected to a remote distance, and since the lights individually diaphragmed by the optical systems are collected, an effective light projection operation can be performed by providing a light collection point at a position in accordance with a projection distance.

According to still further another aspect of the present invention, in a semiconductor light projection apparatus in which optical axes of optical devices are adjusted so as to project collected light onto one light projected area, each of lights being emitted from corresponding one of a plurality of semiconductor light emitting devices, when spots in the light projected area projected by the semiconductor light emitting devices take an ellipsoidal shape, a plurality of optical devices are disposed so that each optical axis of the optical devices is parallel with others on the same plane and at equal intervals, and a plurality of semiconductor light emitting devices are disposed so that spots at the light projected area overlap others by creating a shift in a major axis direction of the ellipsoidal shape. Overlapping portions of the spots in the major axis direction at the light projected area, which are produced by irradiation of the semiconductor light emitting devices shift by a quantity equal to an interval of the semiconductor light emitting devices. As a result, an area where the spots overlap when the lights from the semiconductor light emitting devices are irradiated by the optical devices in parallel, that is, an area, which can be used as the strongest light, becomes a larger rate with regard to a shift quantity which becomes larger as the distance to be irradiated becomes larger. In a remote position which needs a strong light, a overlapping degree is increased, thus effectively irradiating the light.

According to still another aspect of the present invention, in the semiconductor light emitting apparatus in the above described aspect, a plurality of optical devices is constructed in a state where optical axes thereof are adjusted so that lights emitted from a plurality of semiconductor light emitting devices are projected onto a plurality of projected areas. Accordingly, a projection operation can be performed using the projected lights by the semiconductor light emitting devices individually. Also in this case, since the semiconductor light emitting devices are in series connected, a power supply operation can be effectively performed.

According to still another aspect of the present invention, the lights emitted from the plurality of semiconductor light emitting devices are collected, and the collected lights are projected onto a light projected area using semiconductor light projecting apparatuses in which optical axes thereof are adjusted so as to project the collected lights onto one light projected area. At this time, by detection means a time from a light projection time of reflection light to a light receiving time is measured, thus detecting a distance to an object. Accordingly, as described above, lights to be projected are collected effectively, and can be projected onto a light projected area, thus enabling a distance measurement to a more remote distance precisely within the light projected area. In other words, it is possible to perform an effective light projection operation within a distance measurement range to be objected.

According to still another aspect of the present invention, in the above described distance measurement apparatus, since by detection means the semiconductor light emitting devices of the semiconductor light emitting apparatus are allowed to perform light emission in the form of pulses, a light projection operation with a high power can be performed effectively, and a time difference between the light emitted in the form of pulses and a reflection light received by light receiving means is detected based on a difference between rising times of a light projection signal and a light receiving signal, so that a distance can be measured and a measurement with a high reliability can be performed with iteration of the measurement.

According to still further another aspect of the present invention, in the above described distance measurement apparatus, optical axes of the optical devices are adjusted so that a light collection point of lights emitted from the plurality of semiconductor light emitting devices are disposed within a range of a detection distance. A shift of a center point of light emitted from each semiconductor light emitting device can be lessened within the range of the detection distance, and a reduction in a quantity of light can be prevented as possible, thus performing a precise detection operation.

According to still another aspect of the present invention, in the above described distance measurement apparatus, since a position of the light collection point is adjusted to the remotest point within a range of a detection distance, a collection degree of lights from the semiconductor light emitting devices becomes best at the remotest point, thus suppressing occurrence of a shift of a center point. As the light collection point becomes remoter, the collection degree of lights becomes higher. It is possible to suppress a reduction of a quantity of light owing to a shift of a center point. In addition, at a position near than the remotest point, since the semiconductor light emitting devices are disposed in suitable intervals in spite of the shift of the center point of the light is maximum, by appropriately setting a relation between the disposition interval and the spot diameter diaphragmed by the optical system, a collection state in which the shift does not almost exist all over the range of the measurement can be brought about, thus achieving an increase in a detection precision within the range of the distance measurement.

According to still further another aspect of the present invention, in the distance measurement apparatus in which optical axes are adjusted so that a light collection point is positioned within a range of a detection distance, the light collection point being a point where lights emitted from the semiconductor light emitting devices are collected, since a position of the light collection point is adjusted to a middle point within the range of the detection distance, a collection degree of light is highest near the middle point, the shift of the center point is approximately equal to each other in both of the remotest point of the detection range and the nearest point thereof, and this can be set as conditions in which the shift of the center point of the spot light emitted from the semiconductor light emitting devices is least over all of the detection range. Thus, by setting as the light collection point a distance in which a detection precision is highest within the range of the distance measurement, a quantity of light near the light collection point is most increased, thus achieving the detection precision.

According to still further aspect of the present invention, in the above described distance measurement apparatuses, a predetermined range is scanned in a light projection direction by projection light scanning means, and the distance of the object is obtained corresponding to the light projected area based on reflection light detected by detection means. Accordingly, it is possible to detect a range to be projected by dividing it into a projected area, and it is possible to detect a position in which a detected object exists within a wide detection range and a distance in accordance with the projection position. Thus, the detection operation within a wide range can be performed with a higher precision.

According to still further another aspect of the present invention, in the above described constitutions, since the light projection scanning means scans two-dimensionally in the light projection direction, a degree of freedom for setting a range of the detected object is increased, and the range of application use can be also increased.

According to still further aspect of the present invention, the distance measurement which measures a distance by measuring a propagation time of the reflection light is loaded on a moving body, and a distance within a light projected area existing in its running direction is detected. Accordingly, in a moving body used as traffic means such as automobiles or a manned or unmanned moving body such as transportation apparatuses and robots, a distance to an object within a light projected area in a running direction can be detected. As a result, the distance measurement apparatus can be applied to wide applications in such manners that obstacles disturbing advances of men or objects, which exist in a running direction, are detected, or an object to be pursued is detected.

According to still further another aspect of the present invention, the distance measurement apparatus can be used by loading this apparatus on automobiles in the following manners. Specifically, when obstacles existing in a running direction is detected by loading the distance measurement apparatus on automobiles, notification is made by alarming occurrence of dangerous situations, a proper measure such as reducing a speed is taken. When an automobile pursues another automobile running ahead, the automobile running ahead is detected, and running is controlled while keeping a suitable distance between the automobiles.

Furthermore, in the moving body which does not run on tracks, a deviation between the running direction and the direction of the automobile sometimes becomes large. Also in this case, the detection range is scanned and the distance is detected, whereby detected information can be utilized by selecting only a man or an object existing in a position corresponding to the running direction. Moreover, in the case where a semiconductor laser device is used as the semiconductor light emitting device, the detection range can be set to a remote distance. Specifically, a distance of about 100 m or more can be detected surely so as to keep properly a distance between the automobile loading the apparatus and the automobile running ahead on a highway.

According to still further another aspect of the present invention, in a distance measurement apparatus which is loaded on a moving body and detects a distance in a light projected area corresponding to its running direction, in the case where spots in the light projected area of the semiconductor light emitting devices take an ellipsoidal shape, the spot of light emitted by the semiconductor light projection apparatus is set so that a major axis direction of the ellipsoidal shape is arranged in a perpendicular direction to a road surface. Accordingly, a detection resolution in a horizontal direction of a moving plane can be raised. Thus, when this apparatus is used for, example, automobiles, it is possible to detect the direction and position of the body existing in the running direction.

According to still further another aspect of the present invention, a semiconductor light projection, in which an optical axis is adjusted so as to project lights emitted from a plurality of semiconductor light emitting devices onto a plurality of light projected areas, is provided. Reflection lights from an object existing on the plurality of light projected areas of the semiconductor light projection apparatus are received by light receiving means. A distance to the object existing in the light projected areas is detected. Thus, a wide detection area can be set, and the object existing in the detection area can be detected.

According to still further another aspect of the present invention, the above described constitution is loaded on a moving body and an object in the light projected area which is set around the moving body is detected. When an automobile and a unmanned transportation automobile run so as not to touch objects around them, this apparatus can be used. Alternatively, this apparatus can be used for preventing that damages of the automobiles occurs owing to collision with objects around the automobiles in a narrow region.

BRIEF DESCRIPTION OF THE DRAWINGS

For a more complete understanding of the present invention and the advantages thereof, reference is now made to the following description taken in conjunction with the accompanying drawings, in which;

FIGS. 19A and 19B are band diagrams of an active layer to explain the band gap according to the sixth embodiment of the present invention;

FIG. 21 is a view showing MPE with respect to human eyes in an interbeam observing state indicated by the relationship between light-emitting wavelength and exposure time according to the sixth embodiment of the present invention;

DETAILED DESCRIPTIONS OF THE PREFERRED EMBODIMENTS

First Embodiment

A first embodiment in which the present invention is applied to a distance measurement apparatus built in an automobile will be described with reference to FIGS. 1 to 10.

A distance measurement apparatus 11 is built in an automobile (see FIG. 7), and disposed within a dashboard and a bonnet, or on a bumper, so as to project light toward the front of the automobile. As described later, the distance measurement apparatus 11 scans beam spots over a predetermined range in front of the automobile, thus detecting a distance from an object existing within the predetermined range.

Figure 4:
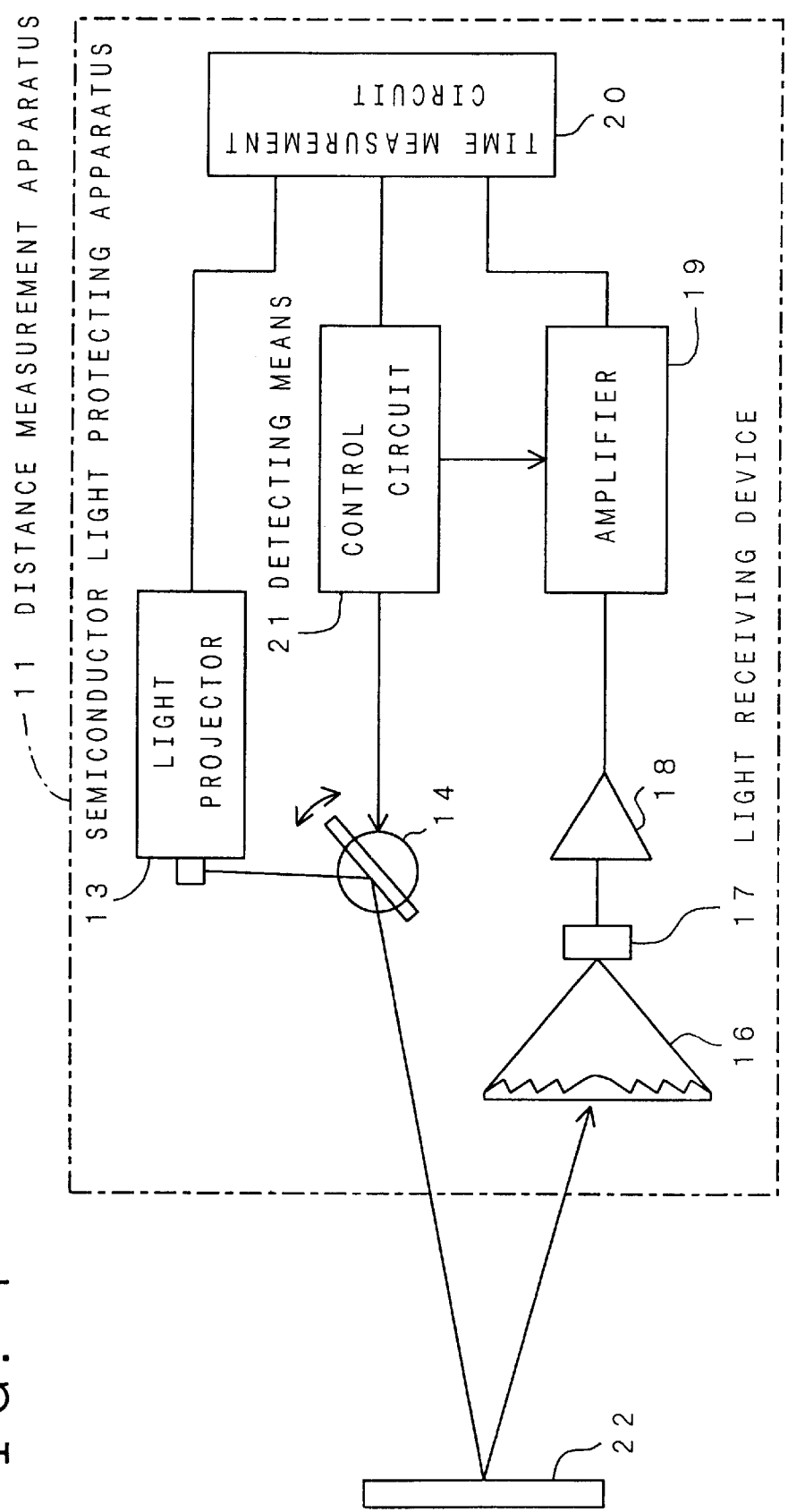
FIG. 4 is an outlined block diagram of a distance measurement apparatus according to the first embodiment of the present invention.

As shown in FIG. 4, the distance measurement apparatus 11 is composed of a light projector as a semiconductor light projection apparatus, a scanning section 14 as projected light scanning means for scanning projected light over a predetermined range, a light receiving device 17 for receiving reflected light via a Fresnel type light receiving lens 16 and photoelectrically converting the reflected light to a light receiving signal to output it, a preamplifier 18 for amplifying the light receiving signal, a variable amplification rate amplifier 19, a time measurement circuit 20 for measuring a time from a light projection to a light receiving, and a control circuit 21 for controlling a light receiving operation, a detection operation and the like.

Figure 1:
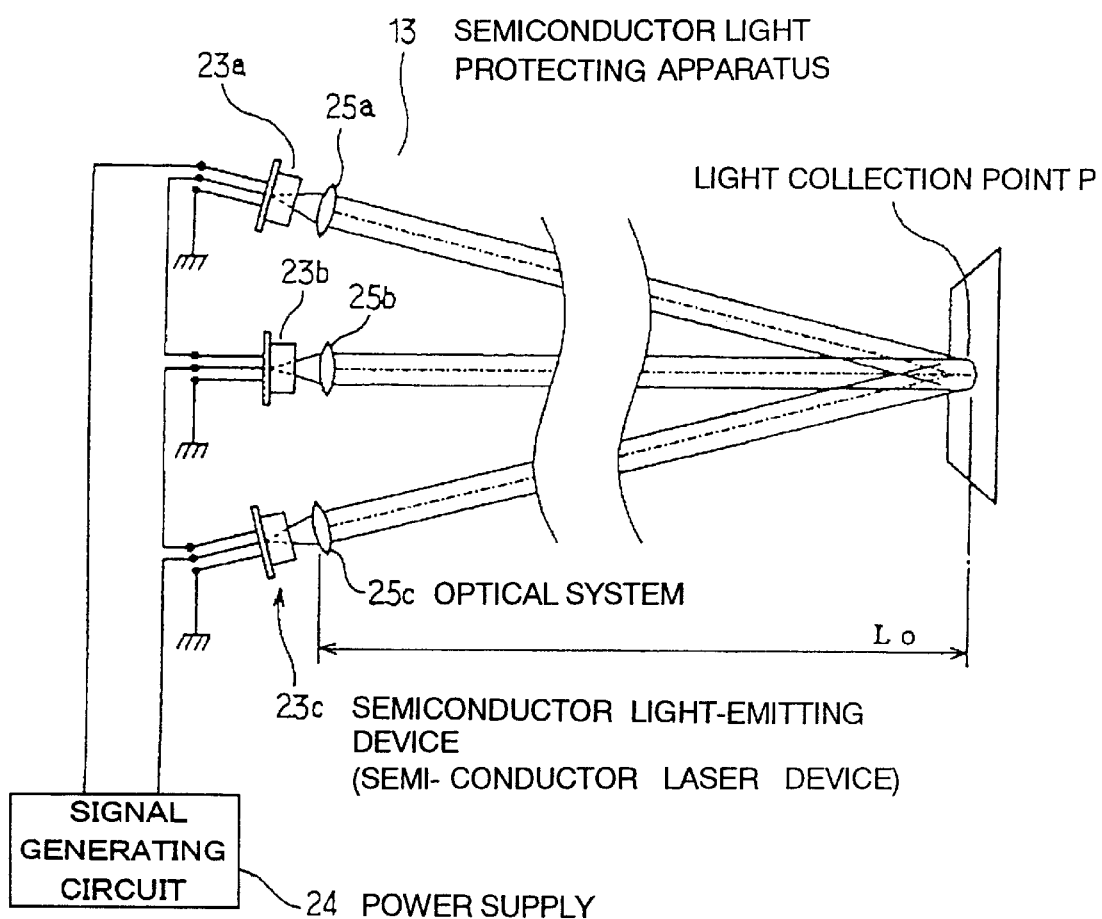
FIG. 1 is an electrical structural diagram of the main parts of a light projector according to a first embodiment of the present invention.
Figure 2:
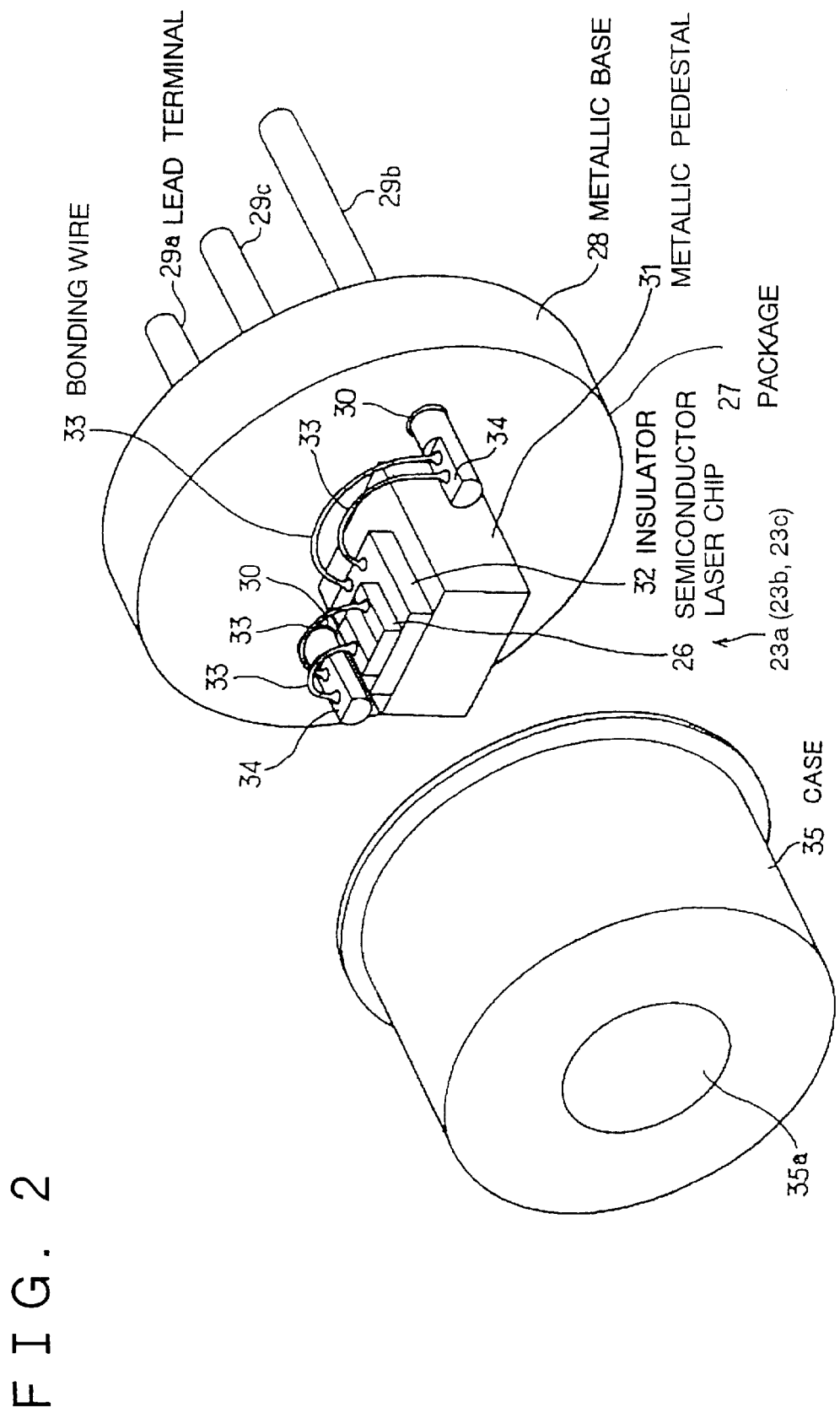
FIG. 2 is an exploded perspective view (No. 1) showing the internal structure of a semiconductor laser device according to the first embodiment of the present invention.

The light projector 13 has three semiconductor laser devices 23a to 23c as a semiconductor light emitting device incorporated therein, as shown in FIG. 1. These semiconductor laser devices 23a to 23c are coupled in series, and coupled to a signal generating circuit 24 as a power source, respectively. In each package of the semiconductor laser devices 23a to 23c, a lead terminal for holding its case at a ground potential is provided, and the lead terminal is coupled to a ground terminal. In front of the three semiconductor laser devices 23a to 23c, lenses 25a to 25c as an optical device for converting laser beam emitted from each of the devices 23a to 23c to parallel light are respectively disposed.

The three semiconductor laser devices 23a to 23c are arranged at predetermined intervals, and each optical axis of the semiconductor laser devices 23a to 23c is adjusted so that the laser beams which are emitted from the laser devices 23a to 23c and projected via the corresponding lenses 25a to 25c are collected at a predetermined distance. Here, as the predetermined distance, a distance Lo, for example, about 70 m, is set, which is a distance from the lenses 25a to 25c to a middle point of a distance to be measured, which ranges from Lmin to Lmax, for example, ranging from 20 m to 120 m.

The signal generating circuit 24 is constituted so that it allows pulse-like current to flow into the semiconductor laser devices 23a to 23c and the semiconductor laser devices 23a to 23c perform laser oscillation to project pulse-like light. At this time, the pulse-like current is set so as to have a pulse width of 50 nsec and so as to allow the semiconductor laser devices 23a to 23c to emit light of a repetitive period of 5 kHz, and the pulse-like current is set to so as to have a peak value of about 14A and so as to allow each of the semiconductor laser devices 23a to 23c to emit light having a peak power of about 14 W.

Figure 5:
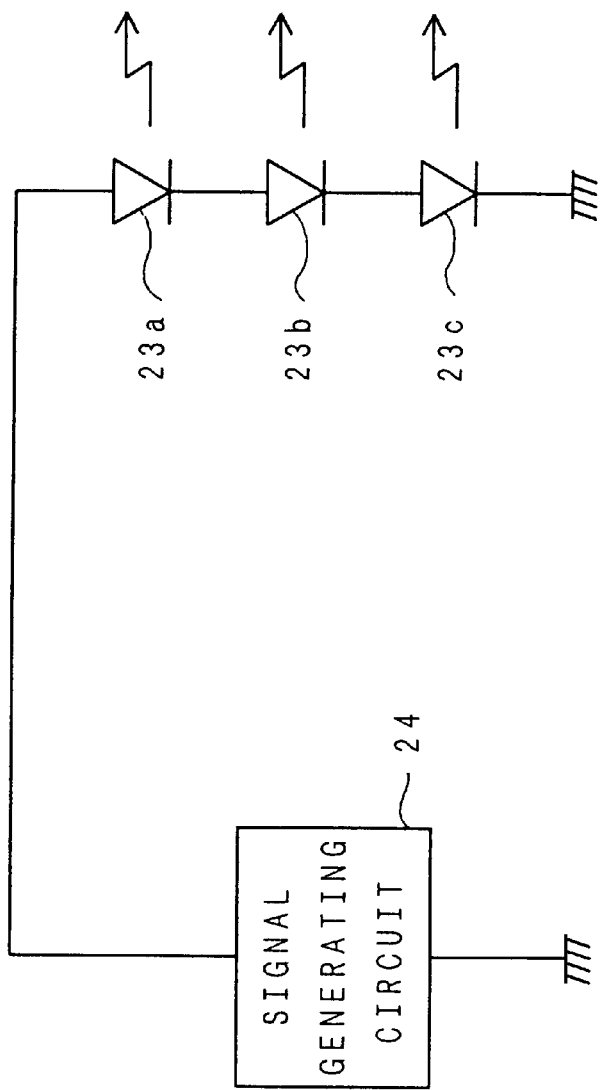
FIG. 5 is an equivalent circuit diagram of a light projector according to the first embodiment of the present invention.

As shown also in FIG. 5, since the semiconductor laser devices 23a to 23c, that is, the three laser diodes, are coupled to the signal generating circuit 24 in the state where they are coupled in series to each other, the current value to be allowed to flow into the semiconductor laser devices 23a to 23c in total is equivalent to that to flow into one semiconductor laser device 23a. Considering impedance matching, since a constitution which consumes power by providing resistors for adjustment is not required, power supply can be performed effectively with less current.

The light receiving device 17 is constituted by, for example, a photodiode, which photoelectrically converts the reflected light received via the light receiving lens 16, and outputs it as the light receiving signal. The light receiving signal amplified by the preamplifier 18 and the variable amplification rate amplifier 19 is output to the time measurement circuit 20. The time measurement circuit 20 measures a delay time td based on a projected light pulse signal and a light receiving pulse signal respectively supplied from the light projector and the variable amplification rate amplifier 19, and outputs the delay time td to the control circuit 21. The control circuit 21 controls these circuits and components so as to be driven properly, and calculates a measured distance from the semiconductor light projection apparatus to the projection region based on data relating to the delay time td, which is given from the time measurement circuit 20. The control circuit 21 stores the measured distance therein.

Next, structures of the semiconductor laser devices 23a to 23c will be described in detail. In this embodiment, since the measured distance is set to a wide range from about 20 m to about 120 m, a semiconductor laser device 26 is used as the semiconductor device which is capable of projecting surely light onto a remoter detection region. This semiconductor laser device 23a (23b, 23c) has a structure as shown in FIGS.

Figure 3:
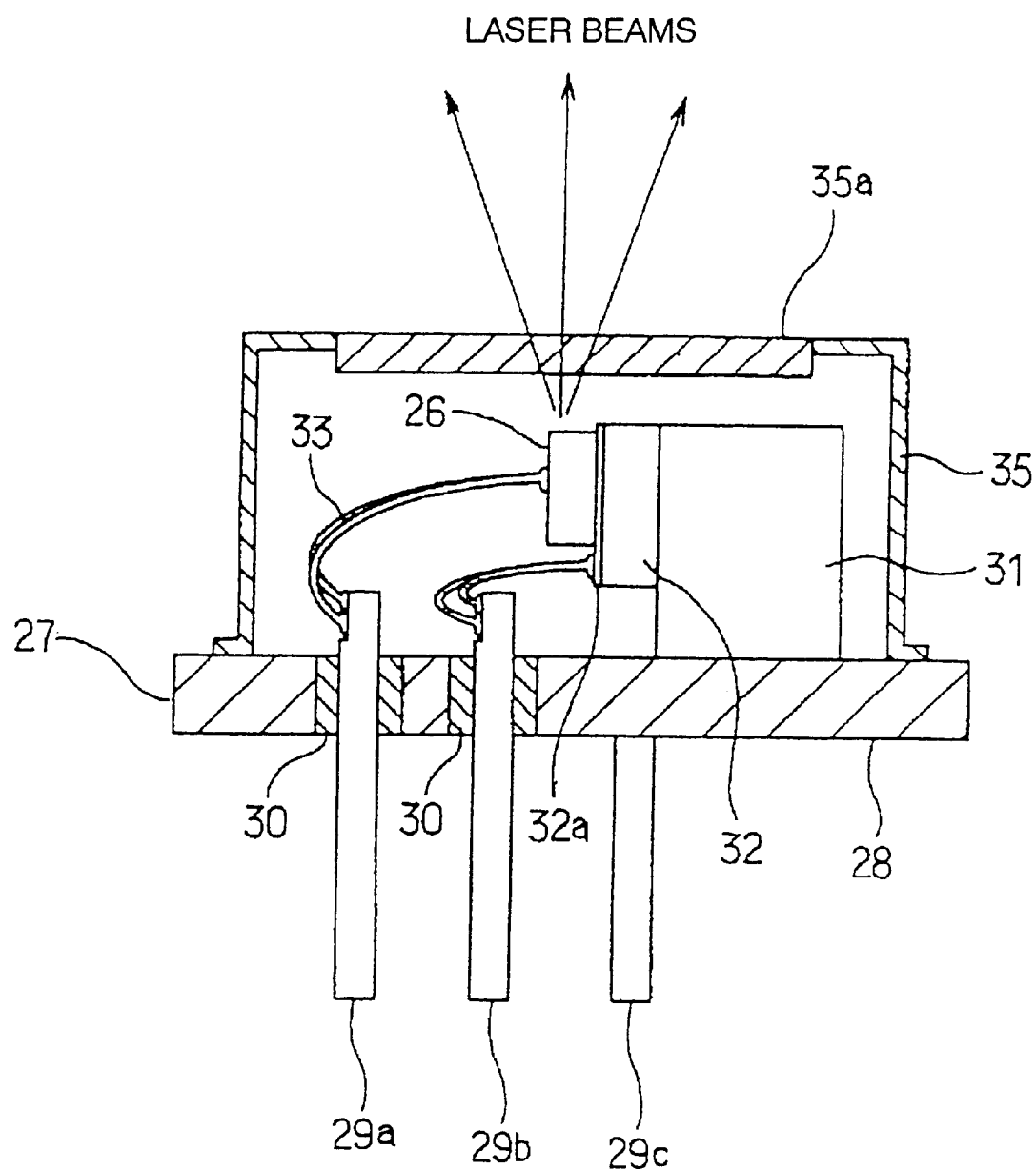
FIG. 3 is a schematic vertical longitudinal sectional view of the semiconductor laser device according to the first embodiment of the present invention.

2 and 3. Note that the structure of the semiconductor laser device in FIG. 3 is illustrated in a state where arrangements of components of the semiconductor laser device in FIG. 3 are different from actual arrangements thereof.

The semiconductor laser device 26 loaded on the package 27 adopts a stripe type structure having a wide stripe width of 100 μm or more, which is suitable for emitting light exhibiting large power output. A compound semiconductor substrate of GaAs group is used as a material, and the semiconductor laser device 26 is constituted by stacking an active layer and a plurality of compound semiconductor layers on this substrate. In this case, as the active layer, the one having a double hetero structure or a quantum well structure can be used. As the substrate material, an InP substrate and a sapphire substrate can be used besides the GaAs substrate.

The semiconductor laser device 26 in this embodiment constituted by forming a material of a GaAs/AlGaAs group by an epitaxial growth on the n-type GaAs substrate, and the AlGaAs layer is used as the active layer. As the materials of the active layer, an InGaAsP—InP group, an InGaP—InGaAlP group, an InGaAs—InAs group, a GaAs—GaN group, GaAs—GaInNAs group or the like can be adopted besides the GaAs/AlGaAs group according to demand. Formation steps of the semiconductor laser device 26 will be briefly described below.

As a method to form the compound semiconductor layer on the semiconductor substrate, an epitaxial growth method is employed. The epitaxial growth technique includes a liquid phase epitaxy (LPE) method, a molecular beam epitaxy (MBE) method, a metal organic chemical vapor deposition (MOCVD) method and the like.

An ohmic contact electrode is respectively formed on the upper and lower surface of the substrate, which is constituted by forming the epitaxial layer on the semiconductor substrate. On the upper surface of the substrate, a layered structure constituted by laminating metals such as Au—Zn/Au, Cr/Au, Mo/Au, Ti/Pt/Au and Cr/Pt/Au is formed to a predetermined thickness by an electron beam deposition method, a sputtering method and the like as the P-type electrode. When the electrode must be processed to a predetermined shape, a photolithography processing is performed as a patterning processing, and the electrode is patterned to the predetermined shape by a chemical etching, an ion beam etching or the like. Subsequently, according to demand, an annealing processing for alloying is performed, thus forming the ohmic contact.

Before an electrode on the lower surface of the substrate is formed, in order to make a processing to form a chip easier, the rear surface of the substrate is polished so that the thickness of the substrate is, for example, about 100 μm. This thickness of the substrate may be about one-third or less of a cavity length, and the cavity length ranges from about 300 μm to about 1 mm. As the thickness of the substrate is thinner, a heat radiation property becomes better. Accordingly, when a workability is taken into consideration, the thickness of the substrate should be at a range of 50 μm to 200 μm. When a reflection plane is formed by dry etching and the like without using a cleavage plane, this condition relating to the thickness of the cavity length is unnecessary, so that the thickness of the substrate can be set to a proper value.

Thereafter, an n-type electrode is formed on the lower surface of the substrate, that is, on the rear surface thereof. As material of the n-type electrode, a layered structure made of metals such as Au—Ge/Ni/Au and Au—Sn/Au is formed, and after formation of the layered structure, an alloying processing is performed, thus forming the ohmic contact. Next, a soldering layer is formed on the surface of the n-type electrode formed on the rear surface of the substrate by a vapor phase growth method. As a material of the soldering layer, Au—Sn or Pb—Sn is used, and the vapor phase growth method includes a electron beam deposition method, a resistor heating deposition method, a sputtering method, an ion plating method and the like. The formation of the soldering layer is conducted by properly selecting a method among these methods according to demand.

Next, the substrate is processed to a chip having a predetermined size. At this time, since an emission plane of the semiconductor laser device for emitting light must be a mirror plane so as to perform laser oscillation, the emission plane of the semiconductor laser device is made to be a cleavage plane, or the mirror plane is formed by a dry etching, thus forming a light emitting end surface. Moreover, with reference to the light emitting end surface, in order to protect the end surface and to increase light output power, a thin film exhibiting a low reflectivity is formed on the output end surface side, and a thin film exhibiting a high reflectivity is formed on the reflection plane side.

In this case, the reflectivity of the thin film exhibiting a low reflectivity should be at a range of about 2% to about 25%, and the reflectivity of the thin film exhibiting a high reflectivity should be at a range of about 80% to about 100%. Moreover, the thin films can adopt any of a single-layered film and a multi-layered film. The case of the thin film exhibiting a low reflectivity should be a single-layer film made of $Al_2O_3$, $SiO_2$, SiNx, SiC, C, MgO or the like, and the thin film exhibiting a high reflectivity should be a multi-layered film having a structure in which films made of $Al_2O_3$, $SiO_2$, SiNx, C, MgO, a-Sim $Cr_2O_3$, $TiO_2$ are stacked, each having a different refractivity from others. In the case where a later described light emitting diode is formed, the cleavage plane is unnecessary. Accordingly, the reflection film needs not to be formed on the end surface, so that the substrate can be processed to a chip using a general dicing cutting method.

The package 27 uses a metallic case having three terminals for use in an optical device, which is used for loading, for example, one transistor and two diode devices. In the package 27, three lead terminals 29a, 29b and 29c are fixed to a metallic base 28, and the lead terminals 29a and 29b are provided in a state where the lead terminals 29a and 29b are insulated from the metallic base 28 through an insulator 30 made of glass or the like, which exhibits a sealing property. Moreover, the lead terminal 29c is provided in a state where the lead terminal 29c electrically conducts to the metallic base 28. This situation is illustrated in FIG. 3.

Among these lead terminals 29a, 29b and 29c, the lead terminals 29a and 29b insulated from the metallic base 28 are electrically connected to the semiconductor laser device 26. The lead terminal 29c, which is electrically connected to the metallic base 28, is grounded so as to hold the device at ground potential.

A metallic pedestal 31 assuming a block shape is fixed to the metallic base 28 in a state where the pedestal 31 electrically connects to the metallic base 28, and the pedestal 31 functions as a heat sink. As a material for the metallic pedestal 31, materials such as Fe and Cu, which exhibit a high heat conductivity, are selected, and a metal such as Au, which exhibits a high electrical conductivity, is formed on the surface of the metallic pedestal 31 by plating, deposition, sputtering or the like.

A GaAs insulating substrate 32 as an insulating plate is fixed onto the metallic pedestal 31. The GaAs insulating substrate 32 is formed in the following manner. Specifically, a SiON film, which is in an amorphous state, is formed on the front and rear surfaces of the GaAs insulating substrate 32 to a thickness of about 200 nm by a plasma CVD method or the like, and a Cr/Ni/Au films are formed on both surfaces of the GaAs insulating substrate 32 by a deposition method so that the respective films have thicknesses of about 50 nm, about 300 nm and about 50 nm. Subsequently, this substrate is subjected to a dicing cutting, so as to be a size of about 1 mm square.

The GaAs insulating substrate 32 is jointed onto the metallic pedestal 31 using a Au—Sn soldering foil, and the semiconductor laser device 26 is fixed onto the GaAs insulating substrate 32. For example, a Au—Sn thin film is formed on the rear surface of the semiconductor laser device 26 to a thickness of about 1.5 $\mu$m, and the plane where the Au—Sn thin film is formed is connected to the GaAs insulating substrate 32. Although an electrode formed on the rear surface of the semiconductor laser device 26 is made to be insulated from the metallic pedestal 31, the electrode formed on the rear surface of the semiconductor laser device 26 can electrically conduct to the outside of the device by a conducting film 32a such as an electrode film and a soldering layer, formed on the front surface of the GaAs insulating substrate 32.

Note that the besides the GaAs insulating substrate 32, an insulating substrate made of ceramics such as aluminum oxide, aluminum nitride, silicon oxide and silicon nitride, and a semi-insulating substrate formed by diffusing impurities into a semiconductor such as Si and GaAs may also be used. Furthermore, another insulating substrate formed in such a manner that $SiO_2$, SiNX, $Ta_2O_3$, a-C or the like are grown on a surface of a metal or a surface of a semiconductor substrate such as Si and GaAs by a CVD method, a sputtering method, a deposition method, a thermal oxidizing method or the like may also be used. With regard to workability, the ceramic substrate material made of aluminum oxide, aluminum nitride, silicon oxide, silicon nitride or the like is very hard, and cutting for such material to about 1 mm square is difficult. Accordingly, the semiconductor substrate is effective for a practical use.

As an adhesion material, besides the above-described Au—Sn thin film, a soldering material such as Pb—Sn may be employed. When an electrical connection is unnecessary as described later, adhesive for use in general dye-bonding can be used.

An electrical conduction between the semiconductor laser device 26 and the lead terminals 29a and 29b can be achieved by Au wires 33. The two Au wires 33 connects the electrode formed on the upper plane of the semiconductor laser device 26 and a bonding planer 34 of the lead terminal 29a, and another two Au wires 33 connect the exposed portion of the GaAs insulating substrate 32 and the bonding plane 34 of the lead terminal 29b. As the bonding wire, besides the Au wires 33, various kinds of wires such as a Au wires containing silicon, a Pt wire, an Al wire and a Cu wire can be employed.

The bonding planes 34 of the lead terminals 29a and 29b, which take a column-like shape, are formed to be flat so as to achieve easiness of bonding, thus increasing an intensity of boding. Accordingly, a reliability of the bonding also increases. Note that the electrodes formed on the upper plane of the semiconductor laser device 26 are respectively bonded by the bonding wires 33 onto both sides of the stripe portion of the light emitting region. Specifically, the two bonding wires 33 from the electrodes are bonded to the both sides of the stripe portion, respectively.

Figure 9:
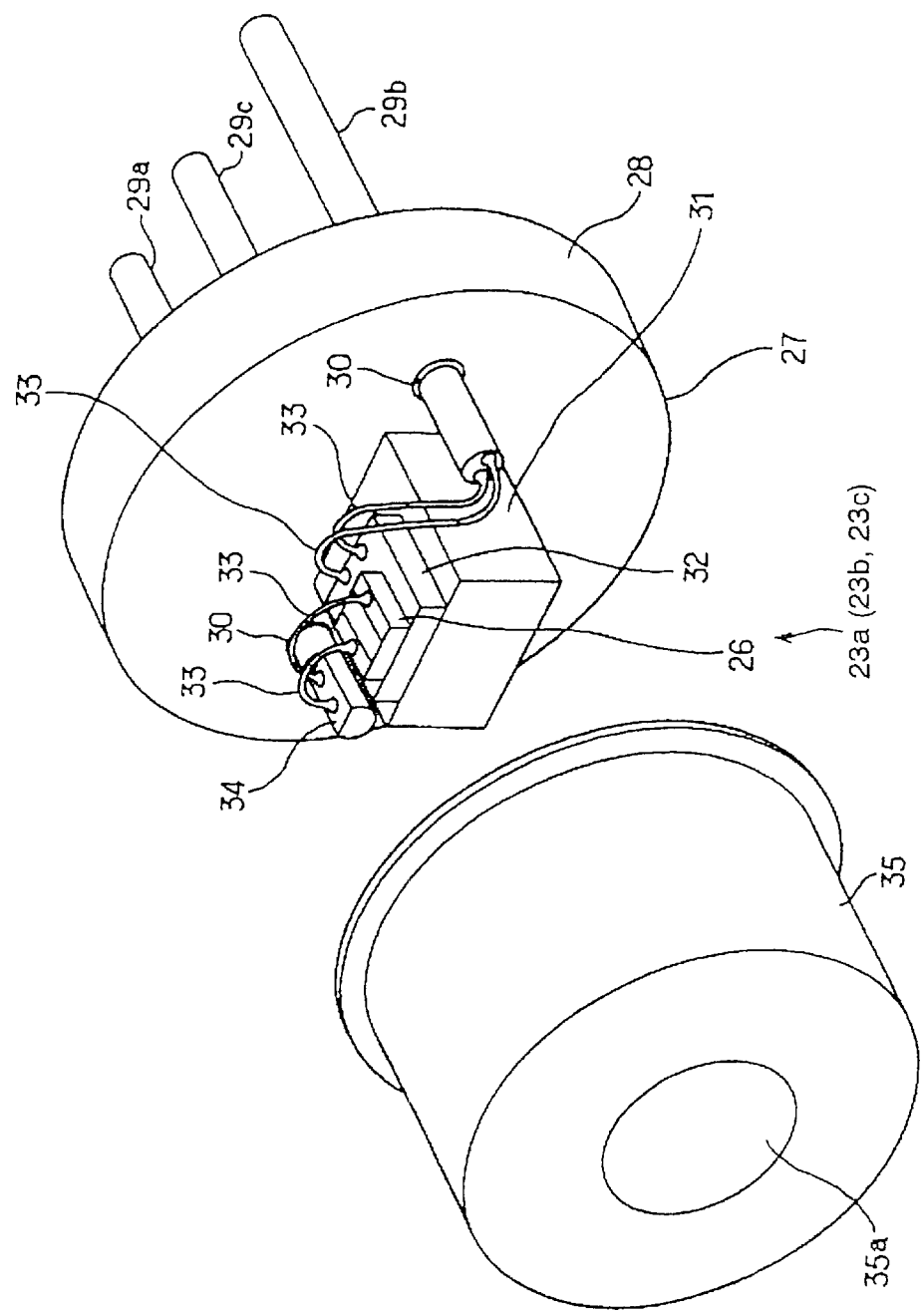
FIG. 9 is an exploded perspective view (No. 2) showing the internal structure of a semiconductor laser device according to the first embodiment of the present invention.
Figure 10:
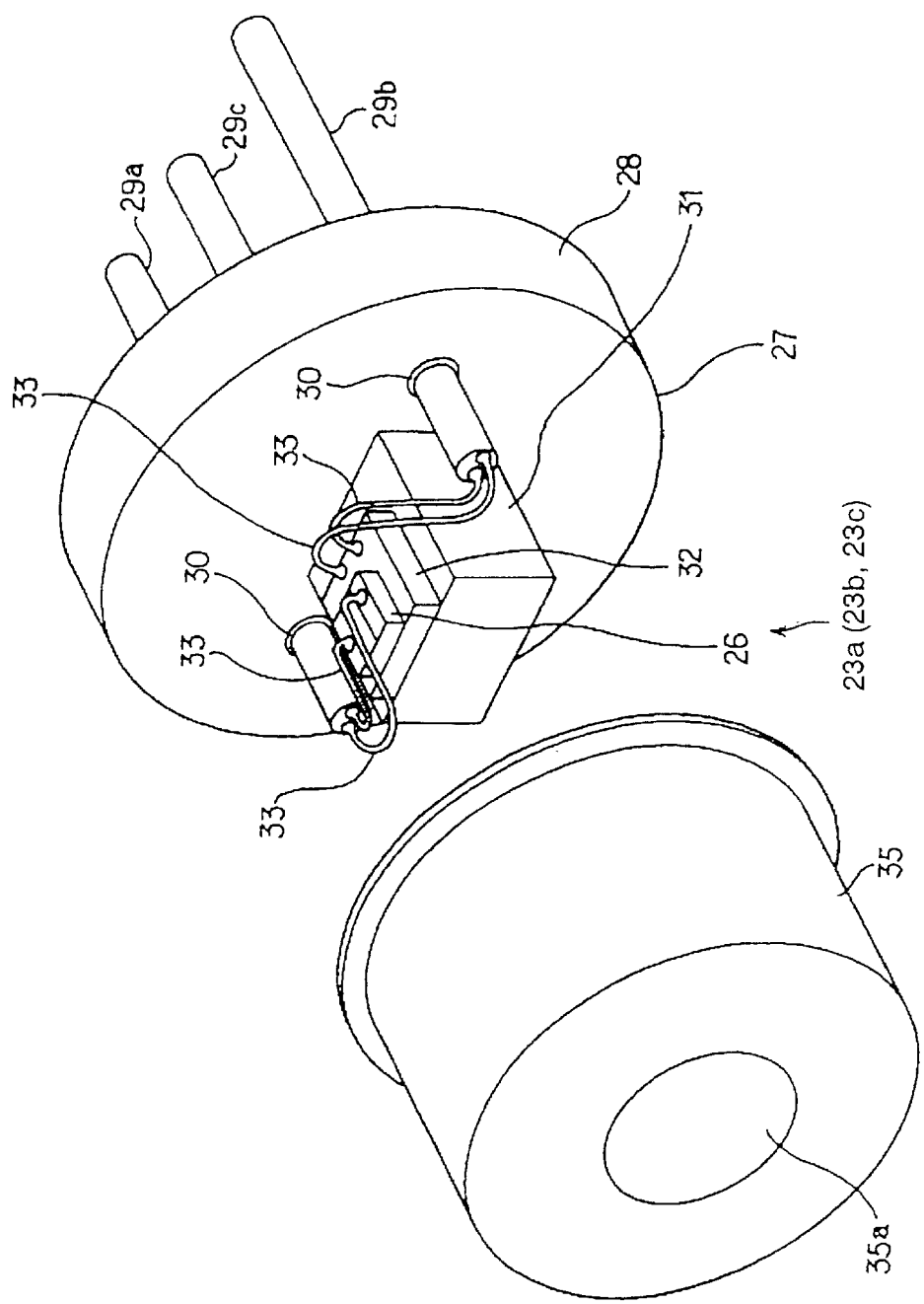
FIG. 10 is an exploded perspective view (No. 3) showing the internal structure of a semiconductor laser device according to the first embodiment of the present invention.

In the above described structure, the flat bonding planes 34 are respectively formed on the sides of the lead terminals 29a and 29b, and the bonding wires 33 are bonded thereto. In stead of this structure, as shown in FIGS. 9 and 10, it is possible to perform the bonding using a flat portion of the end surface of each of the lead terminals 29a and 29b without forming the bonding plane 34. Thus, it is possible to omit the step for forming the bonding plane 34.

In other words, in the structure of FIG. 9, a package in which the bonding plane 34 is provided only in one lead terminal 29a is used. In this case, although a bonding plane is not formed in the lead terminal 29b, the Au wire 33 is bonded to the flat portion of the end surface of the lead terminal 29b. Moreover, in the structure of FIG. 10, the bonding plane is not formed in both of the lead terminals 29a and 29b, and the Au wires 33 are respectively bonded to the flat portions of the end surfaces of the lead terminals 29a and 29b.

In the case where the bonding plane 34 is not formed in the lead terminal as described above, a bonding direction at the semiconductor laser device 26 shifts by 90 degrees from that at the end surface of each of the lead terminals 29a and 29b. In an actual bonding step, after the bonding for either the semiconductor device 26 or the lead terminals 29a and 29b is conducted, a supporting stage is rotated by 90 degrees, and then the bonding for the rest is conducted. Since the two Au wires 33 never contact each other and an offset load is not applied to the Au wires 33, the bonding step can be performed without any problem.

Since the constitution in which the two Au wires 33 connect the lead terminals is adopted in the above described cases, the distance measurement can be used without lowering a reliability of its operation in spite of the constitution in which the three semiconductor laser devices 23a, 23b and 23c are in series connected to each other. Specifically, when a malfunction due to a breaking of the Au wire 33 occurs, an electrical conduction can be kept through the other Au wire 33. Even in the case of a malfunction due to a short-circuiting which is expected to occur in the semiconductor laser device 26 itself, the electrical conduction to other semiconductor laser devices 23a, 23b and 23c can be kept.

The case 35 assuming a cylindrical case-like shape serves to perform a can sealing, and the case 35 is fixed to the metallic base 28 so as to cover the semiconductor laser device 26. A glass window 35a is set in the upper plane of the case 35 which guides a laser beam emitted from the end surface of the semiconductor laser device 26 to the outside. The semiconductor laser devices 23a, 23b and 23c having the above described structure are disposed at predetermined positions, and the lenses 25a, 25b and 25c which serve as the optical system as described above are disposed at the emitting portions of the laser beams of the respective semiconductor laser devices 23a, 23b and 23c. The optical axes of the lenses 25a, 25b and 25c are adjusted so as to collect the laser beams at the light collection point P as shown in FIG. 1.

In the package 27, by adopting the above described constitution, the metallic base 28 is not connected to any electrode of the semiconductor laser device 26, and the metallic base 28 can be kept at the ground potential. Accordingly, even when the package 27 is disposed, for example, on the circuit board, an area occupied by a portion having a potential can be reduced, occurrence of a short-circuiting malfunction due to a current leak between the terminals and a contact of them is suppressed, and occurrence of outputting of wrong signals from the circuit can be sufficiently suppressed.

Figure 7:
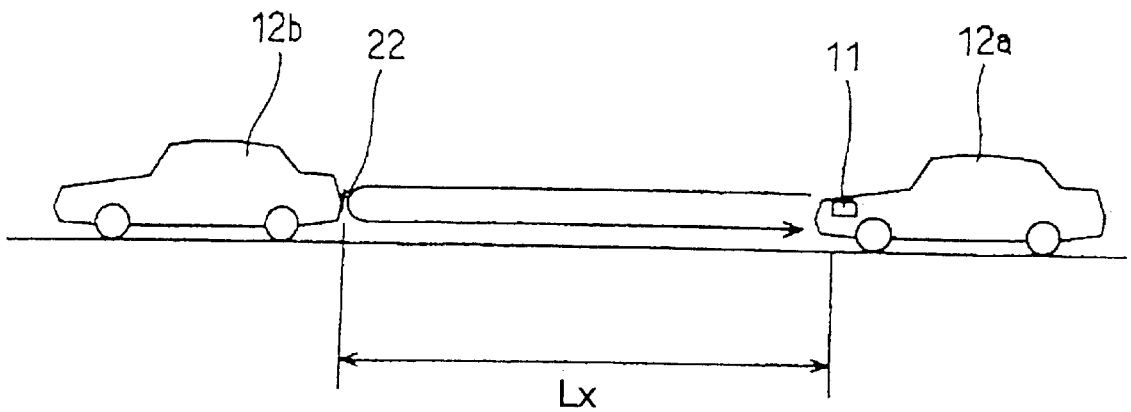
FIG. 7 is a view explaining the relationship in the position of the distance measurement apparatus according to the first embodiment of the present invention.

Next, an operation of this embodiment will be described. As shown in FIG. 7, in the distance measurement apparatus 11, when the control circuit 21 controls the light projector 13 so that the light projector 13 performs a light projection operation, the light projector 13 outputs a laser beam in the forward direction via the scanning section 14 while performing pulse lighting.

Figure 8:
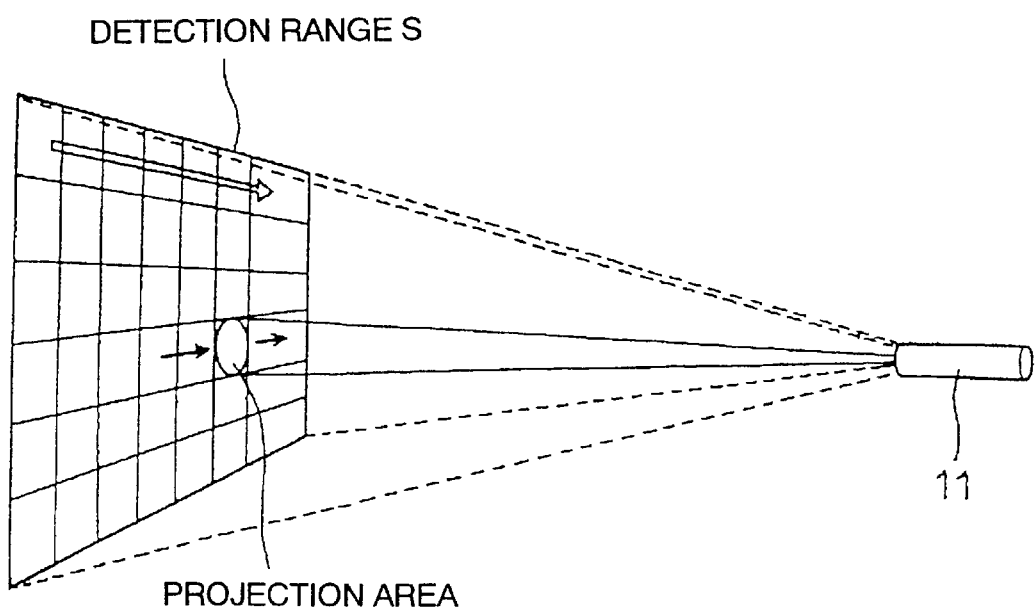
FIG. 8 is a view showing a detection range where laser beams are scanned according to the first embodiment of the present invention.

With reference to the light projection direction of the laser beam, as shown in FIG. 8, the laser beam from the light projector 13 is scanned over the two-dimensional detection range S which spreads in front of the automobile 12 by controlling the rotation of the reflection mirror of the scanning section 14. Timings of the rotation control of the reflection mirror is made to be in synchronization with timings of pulses of the projection light, whereby a distance to the projected area as light projected areas which are arranged in the form of lattice can be detected.

At this time, the laser beam emitted by the lighting is set so as to have a pulse width of 50 nsec and so as to have a repetitive period of 5 kHz as described above. Moreover, the peak value of the pulse current for driving the semiconductor laser device 26 is about 14A. Under these conditions, the peak power of the semiconductor laser device 26 is about 14 W obtained per one semiconductor laser device. When the light projection is performed under these conditions, it was confirmed that an object existing 170 m ahead could be detected.

When the laser beam emitted in the above describe manner is incident onto the reflector 22 fitted to the rear portion of the other automobile 12b existing in the forward direction, the reflector 22 reflects the incident laser beam so that the reflected light travels in the reverse direction to the incidence direction. When the reflected light is incident onto the light receiving device 17 via the light receiving lens 16 of the distance measurement apparatus 11, the light receiving device 17 converts the reflected light to the light receiving signal and outputs the light receiving signal. The preamplifier 18 and the variable amplification rate amplifier 19 amplify the light receiving signal, and the amplified light receiving signal is output to the time measurement circuit 20.

The projection pulse signal for driving the projected laser beam is input to the time measurement circuit 20, and the light receiving signal received by the light receiving device 17 is inputted also to the time measurement circuit 20. The time measurement circuit 20 is designed such that the circuit 20 is capable of measuring a time from the rising-up timing of the light projection pulse to the rising-up timing of the light receiving signal with a high precision. For example, if the time can be measured with a resolution of about 10 nsec, a resolution of the distance measurement can be achieved on the order of meter.

Upon receipt of the data of the delay time Td, the control circuit 21 detects the distance to the object based on the data. As shown in FIG. 7, when the detection distance is Lx (m) and the delay time is td (sec), a time taken for traveling the detection distance Lx forward and backward is td in consideration of the velocity of light c $(=3\times10^8$ m/sec). Therefore, the detection distance Lx is as follows.

$$Lx\ (m) = td \times c/2$$

The control circuit 21 sequentially detects the distance to the object based on the delay time td by the light receiving signal generated from the reflected light at the time when the laser beam is projected onto the detection region. The control circuit 21 estimates based on the detection distance corresponding to each portion in the detection range S what object exists and where the object is located. For example, if the object is another automobile 12b to be detected, it is decided whether the distance to the automobile 12b is within a predetermined range. The control circuit 21 can control the running of the automobile 12a based on the detection data so as to follow the other automobile 12b with a predetermined distance between the automobiles 12a and 12b.

Figure 6:
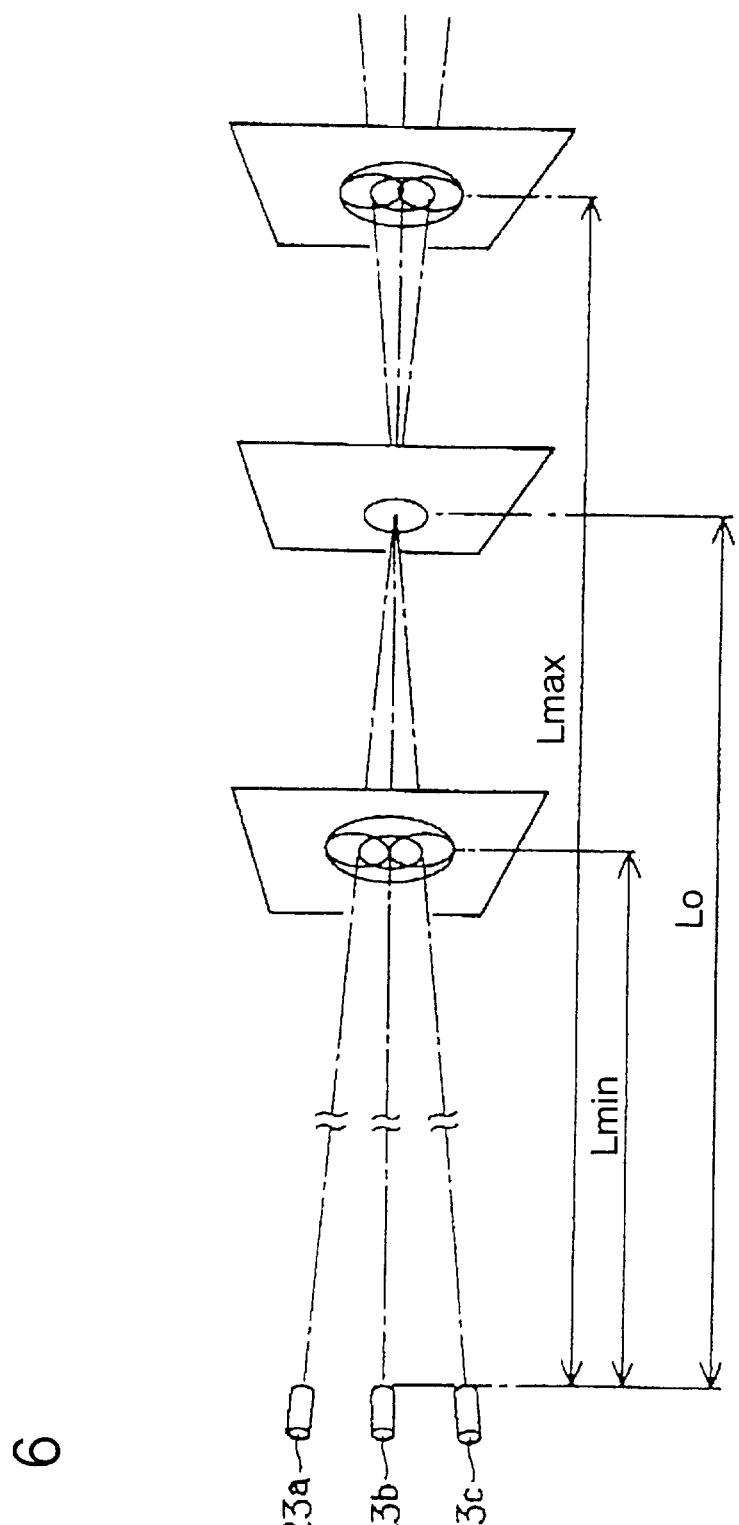
FIG. 6 is a view explaining the relationship between the semiconductor laser devices and light collecting points according to the first embodiment of the present invention.

Next, setting of the optical system will be described. Specifically, when the three semiconductor laser devices 23a, 23b and 23c are provided and the light projection is performed, the precision in detecting the distance depends greatly on where the laser beams emitted from the devices 23a, 23b and 23c should be collected. FIG. 6 is an explanatory view for setting the light collection point P of the three laser beams.

The description is made to the case where a distance from the positions of the light projection lenses 25a, 25b and 25c, which emit the laser beams that are parallel light, to the light collection point P is Lo, a distance from the lenses 25a, 25b and 25c to the closest point within the range of the distance to be detected is Lmin, and a distance from the lenses 25a, 25b and 25c to the remotest point within the range of the distance to be detected is Lmax. As a matter of course, since a quantity of the light is most at the position of the light collection point P, a quantity of the reflected light becomes much. Accordingly, the position of the light collection point P should be set within the detection distance range ranging from Lmin to Lmax.

When there is particularly no portion in which a detection sensitivity is to be increased as the detection distance within the detection distance range, the light collection point P is positioned in the middle point of the detection distance range (Lo=(Lmin+Lmax)/2), whereby a shifting quantity of spots of the laser beams becomes equal at the closest and remotest points and the shifting quantity of the spots thereof can be minimized at the middle point of the detection distance range. Moreover, when within the detection distance range, there is a distance in which the detection sensitivity is to be increased, it is preferable to set the light collection point P in the vicinity of that distance.

Moreover, the shifting quantity of the spots of the laser beams can be in principle reduced by setting the light collection point P at the remotest point relatively. Since the occurrence of the shifting of the spots originates from shifting of the dispositions of the semiconductor laser devices 23a, 23b and 23c, a quantity of shifting of the semiconductor laser devices 23a, 23b and 23c becomes maximum. When the laser beams are collected at the light collection point P, a quantity of shifting of the spots becomes minimum, that is, zero. Accordingly, intervals of the spots showing a quantity of shifting of the spots can be always made to be smaller than the intervals of the semiconductor laser devices 23a, 23b and 23c at a position closer to the light emission point than the light collection point P.

According to this embodiment, the following effects can be obtained.

First, in this embodiment, the three semiconductor laser devices 23a, 23b and 23c are in series connected to the signal generating circuit 24 and the current is supplied from the signal generating circuit 24 thereto, and the respective laser beams are focussed by the lenses 25a, 25b and 25c that are the independent optical system so as to be converted to parallel light. Thereafter, the laser beams are collected and projected. Accordingly, even when the plurality of semiconductor laser devices 23a, 23b and 23c are provided, the respective semiconductor laser devices 23a, 23b 23c can perform the light emitting operation with a quantity of current for one semiconductor laser device. Power loss due to provision of a resistor device for impedance adjustment can be prevented. The laser beams to be collected can be collected within a measurement distance range to be objected. Accordingly, shifting of the spots of the collected laser beams can be reduced to a minimum level, and a reduction in a quantity of light can be suppressed even at the remotest point, so that the distance measurement can be performed effectively with a high precision.

In the above described case, the structure in which the three semiconductor laser devices 23a, 23b and 23c are in series connected is adopted. When the semiconductor laser device 26 causes trouble that the semiconductor laser device 26 malfunctions in lighting by some occasions, the trouble is short-circuiting in many cases. Accordingly, even if one semiconductor laser device is short-circuited, the electrical conduction states of other semiconductor laser devices are not obstructed. Thus, a life time of the light projection operation for the trouble is never limited, and the reliability of the semiconductor laser device 26 can be secured similarly to the case where the semiconductor laser devices are in parallel connected.

Secondly, since the intersection position of three parallel lights is set at the midway of the detection distance range, the shifting quantity of spots of the laser beams can be minimized at both remotest and closest points. Also, a reduction in a quantity of light can be suppressed within the wide detection distance range to a minimum so that the quantity of reflected light can be increased, the extension of the detection distance can be improved, and the improvement of the detection accuracy can be made.

Thirdly, the scanning section 14 is provided such that the laser beam from the light projector 13 is two-dimensionally scanned in the predetermined area of the forward of the automobile 12, and the measurement at each projection area where the scanning has been made can be performed by pulse lighting with respect to the laser beams. As a result, even if the direction of travel of the moving object with no track such as an automobile varies right and left and up and down, it is possible to detect the distance of object existing in the advancing direction in accordance with the variation flexibly.

Fourthly, since the package for three terminals can be used as the package 27 of the semiconductor laser devices 23a to 23c, it is unnecessary to newly manufacture the package. Even in this case, two electrodes of the semiconductor laser device is introduced from the lead terminals 29a and 29b, whereby making it possible to draw the lead terminals 29a and 29b in a state where they are insulated from the metallic base 28. Also, the connection of the metallic base 28 to the ground terminal allows the stable operation to be performed on the package or the circuit configuration.

Fifthly, the AU wires 33 for bonding the semiconductor laser device 26 are structured so that they are bonded to each bonding point two by two. As a result, even if one of them is broken for some reason while it is structured that the current is prevented from being concentrated on one Au wire 33 in a normal case, it is possible to maintain the light emitting state of the other semiconductor laser devices connected in series. Therefore, the limitation of the life time of the light projection operation can be suppressed to a minimum even at the occurrence of breakage.

Second Embodiment

Figure 11:
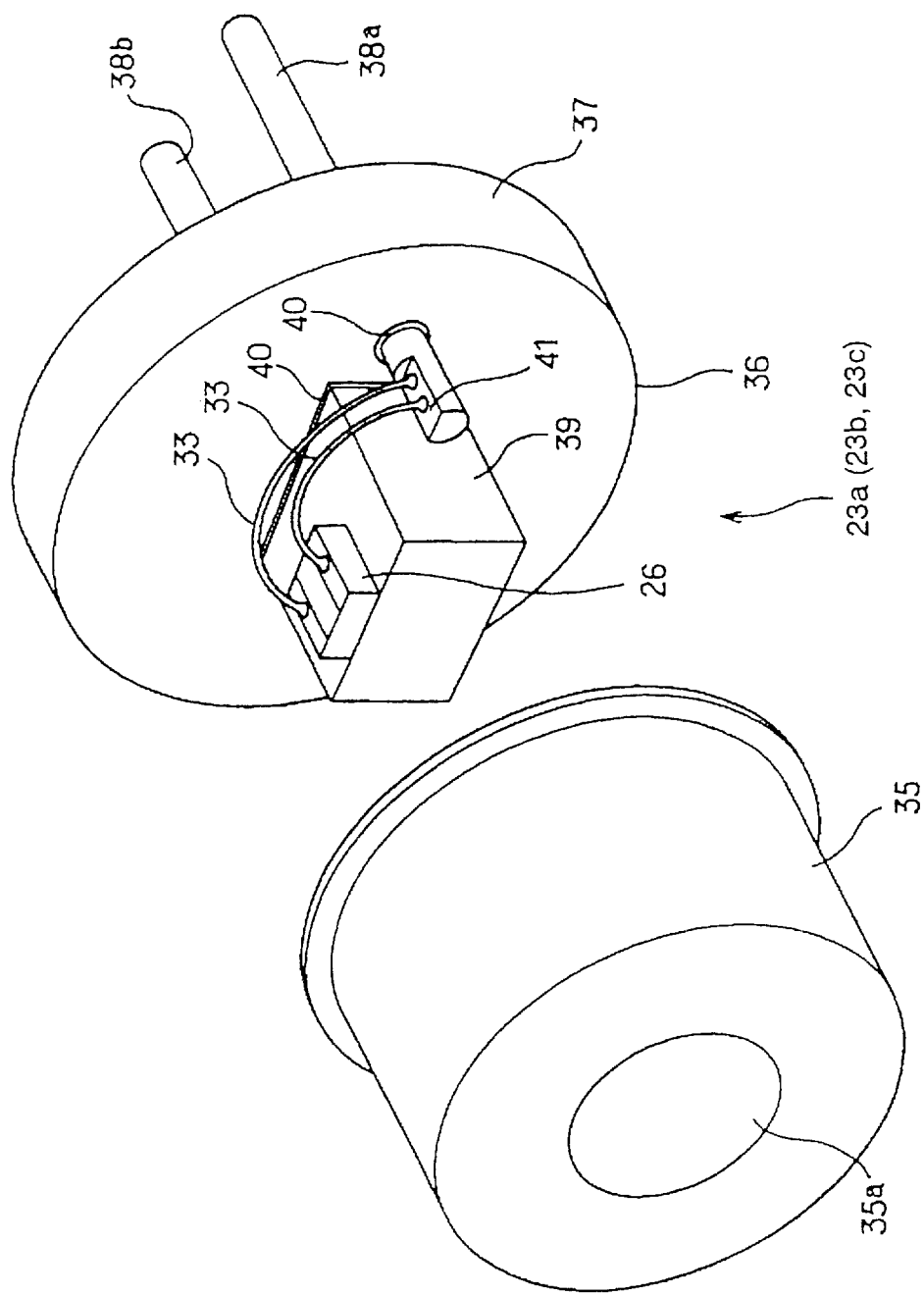
FIG. 11 is an exploded perspective view showing the internal structure of a semiconductor laser device according to a second embodiment of the present invention.
Figure 12:
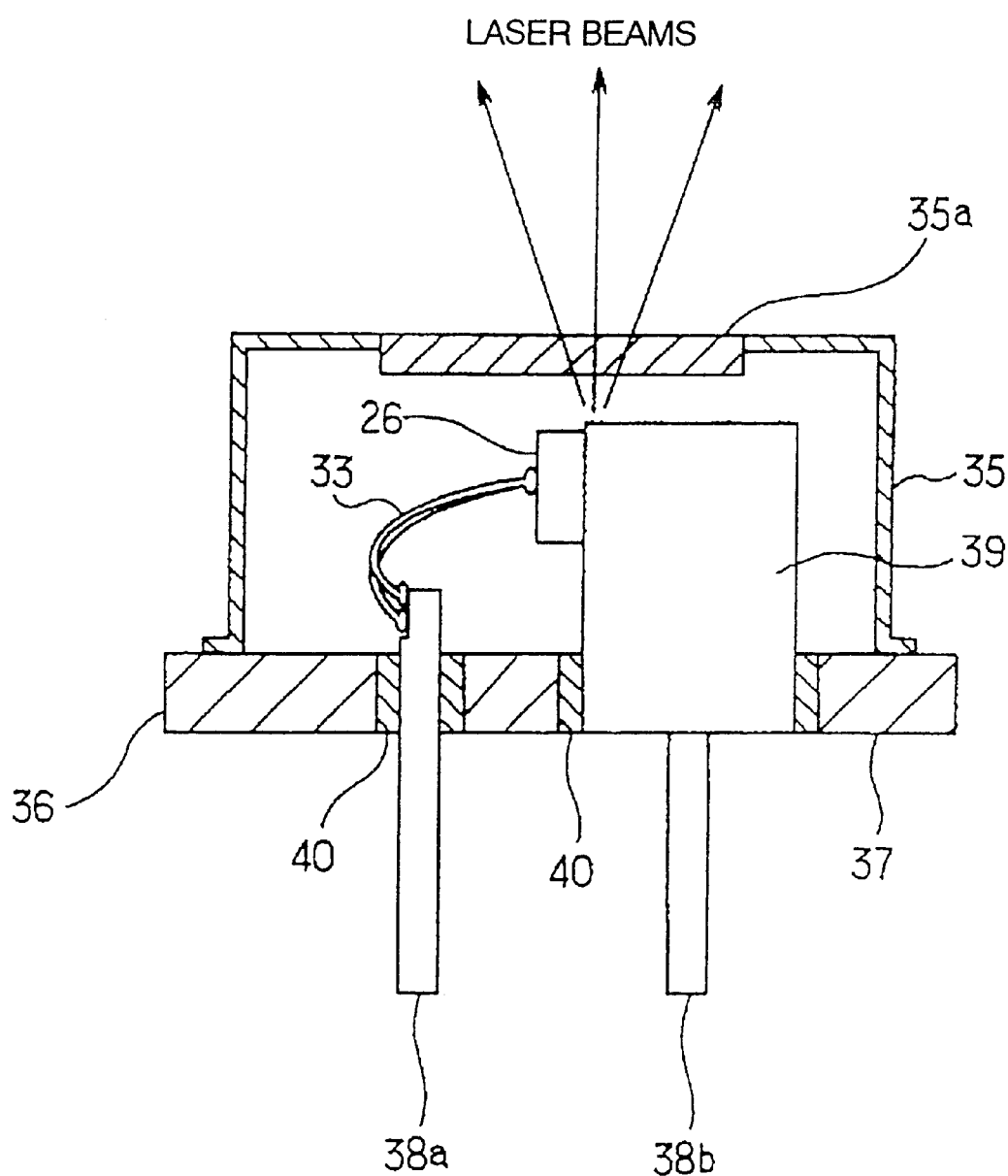
FIG. 12 is a schematic vertical longitudinal sectional view of the semiconductor laser device according to the second embodiment of the present invention.

FIGS. 11 and 12 show the second embodiment of the present invention, and the difference between the first embodiment and the second embodiment lies in the point in which a package 36 is provided in place of the package 27 of semiconductor laser devices 23a to 23c. As shown in FIG. 11, this package 36 comprises lead terminals 38a and 38b fixed to a metallic base 37. A metallic pedestal 39 is provided to be embedded in the metallic base 37 in a state where it is insulated from the metallic base 37 through an insulator 40 made of glass or the like. In the lead terminals 38a and 39b, one lead terminal 38a is fixed to the metallic base 37 through the insulator 40 made of glass or the like, and the other lead terminal 38b is fixed to the metallic pedestal 39 to be electrically conducted thereto.

Also, in this embodiment, as shown in FIG. 11, a semiconductor laser device 26 is directly mounted on the metallic pedestal 39. At this time, a rear face electrode of the semiconductor laser device 26 and the metallic pedestal 39 are adhered and fixed to each other using a Au—Sn soldering foil to be electrically connected to each other. A bonding surface 41, which is partially flatten, is formed on the lead terminal 38a, and a portion between this bonding surface and the upper face electrode is bonded by two Au wires 33. The case 35, which is the same as that of the first embodiment, is used, and the case 35 having the window 35a is fixed to the metallic base 37 and sealed thereto.

The above-structured second embodiment can also obtain the same effect as that of the first embodiment, and have the dedicated package 36, so that the number of bonding steps of Au wire 33 can be reduced, and the metallic base portion 37 can be connected to the ground. In this case, the metallic base portion 37 is not independently formed as a lead terminal, however, it can be mounted on a conductive portion such as a metallic plate, etc, and the respective lead terminals 38a and 38b can be maintained to be insulated from the metallic base 37 and the case 35.

Though the above embodiment has the structure in which the semiconductor laser device 26 is directly adhered and fixed to the metallic pedestal (iron, copper, and the like), the semiconductor laser device 26 may be adhered and fixed thereto in a state where the other conductive plate is provided therebetween. In this case, by selecting such a material that is consistent with the thermal expansion coefficient of the semiconductor laser device 26, improvement of reliability can be made.

Namely, the difference in the thermal expansion coefficient between the metallic pedestal 39 and the semiconductor laser device 26 causes deterioration of the semiconductor laser device 26 if thermal stress is applied onto the semiconductor laser device 26. Here, the use of the conductor plate aims to lessen the thermal stress. More specifically, in a case where the semiconductor laser device 26 is formed of mainly GaAs, the combination in which the conductive plate is formed of the same material of GaAs as that of the semiconductor laser device 26 and the metallic pedestal 39 is formed of iron can enhance the stress lessening effect at the maximum. It should be noted that the insulating substrate 32 shown in FIG. 2 also has the thermal stress lessening function similar to the conductive plate.

Third Embodiment

Figure 13:
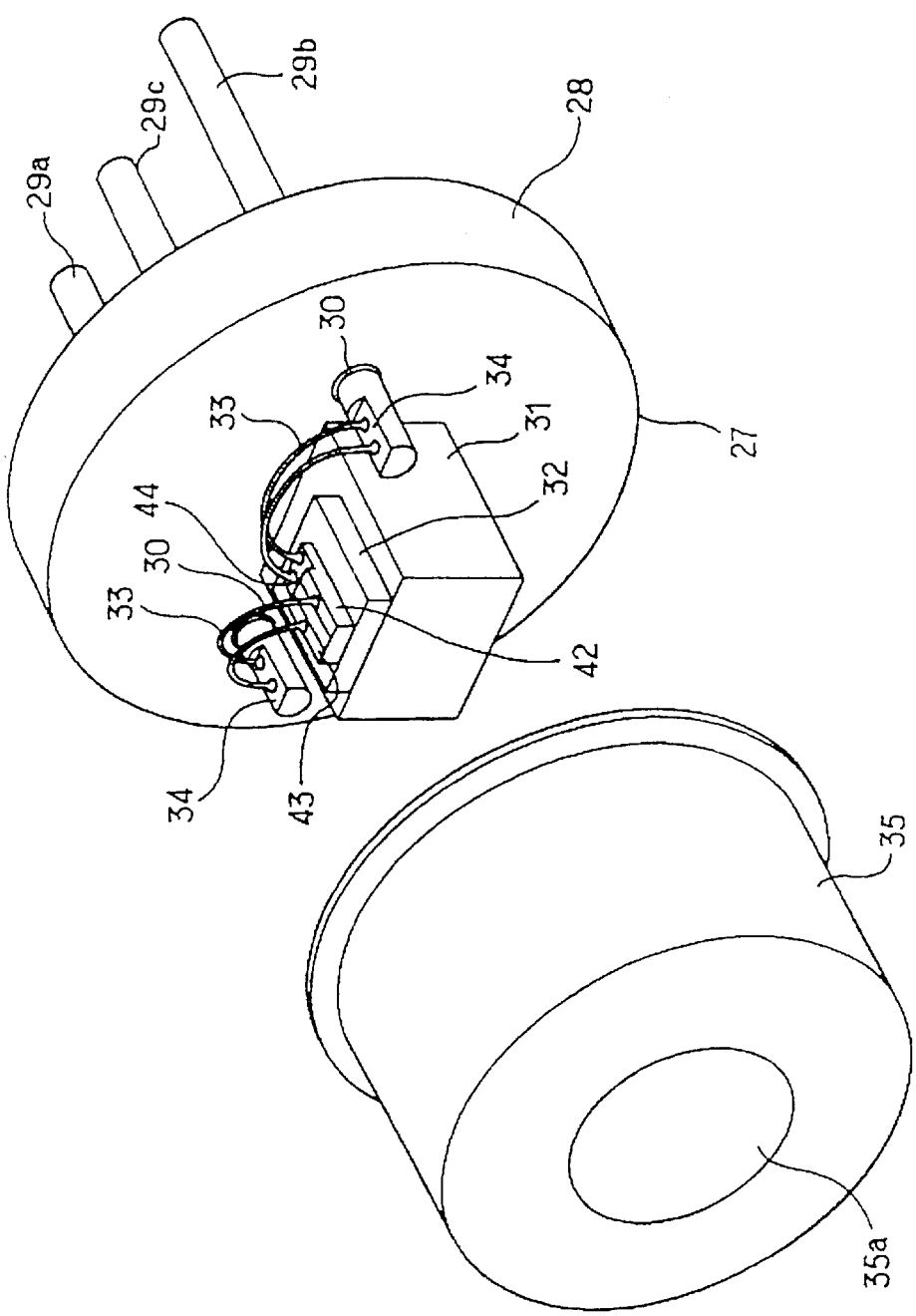
FIG. 13 is an exploded perspective view showing the internal structure of a semiconductor laser device according to a third embodiment of the present invention.
Figure 14:
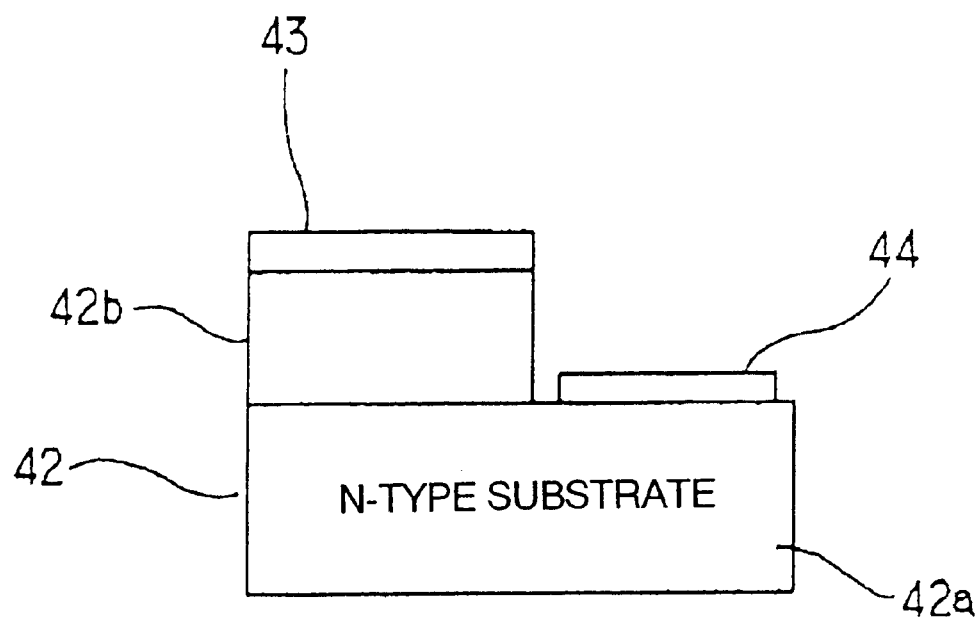
FIG. 14 is a schematic sectional view of a semiconductor laser device 42 according to the third embodiment of the present invention.

FIGS. 13 and 14 show the third embodiment of the present invention, and the difference between the first embodiment and the third embodiment lies in the point in which a semiconductor laser device 42 is provided in place of the semiconductor laser device 26 and the electrode structure thereof is different from that of the semiconductor laser device 26. More specifically, this semiconductor laser device 42, using as the laser device of the GaAs/AlGaAs group, is constituted by stacking numerous layers formed on the GaAs substrate of n-type substrate by the epitaxial growth method. Then, a p-type electrode 43 is formed in the same manner as that of the first embodiment, thereafter, a predetermined portion is removed by the dry etching method until a n-type epitaxial layer 42a formed on the substrate is exposed, and a n-type electrode 44 is formed on the portion exposed by this etching by the aforementioned way.

In other words, it can be said that two electrodes 43 and 44 of the semiconductor laser device 42 form both two electrodes formed on the aforementioned semiconductor laser device 26 to be exposed to the same surface side. Therefore, Au wires 33 are bonded between the electrode 43 and the lead terminal 29a and between the electrode 44 and the lead terminal 29b two by two, respectively. Also, this eliminates the need for electrically connecting the semiconductor laser device 42 to the insulating substrate 32, so that simple adhesion and fixing may be performed.

The same effect as that of the first embodiment can be obtained by even the above-explained third embodiment, and in addition to this, the semiconductor laser devices 42 are structured to be suitable for series connection. This makes it possible to directly perform the bonding of Au wire 33 with respect to both portions, and this eliminates the need for forming the conductive film and the like, serving as a conductive pattern, on the insulator substrate 32 specially.

Since the semiconductor laser device 42 is formed as illustrated in the figure, the end surface for emitting the laser beams, that is, the end surface of the portion etched for forming the electrode 44 is used as a reflecting mirror. Also, the formation of the electrode 44 is not limited to the side where the reflecting mirror is thus formed, and the electrode 44 may be formed in a direction, which extends to both sides of the stripe, and in this case, the reflecting mirror portion of laser beams can be formed by cutting.

Fourth Embodiment

Figure 15:
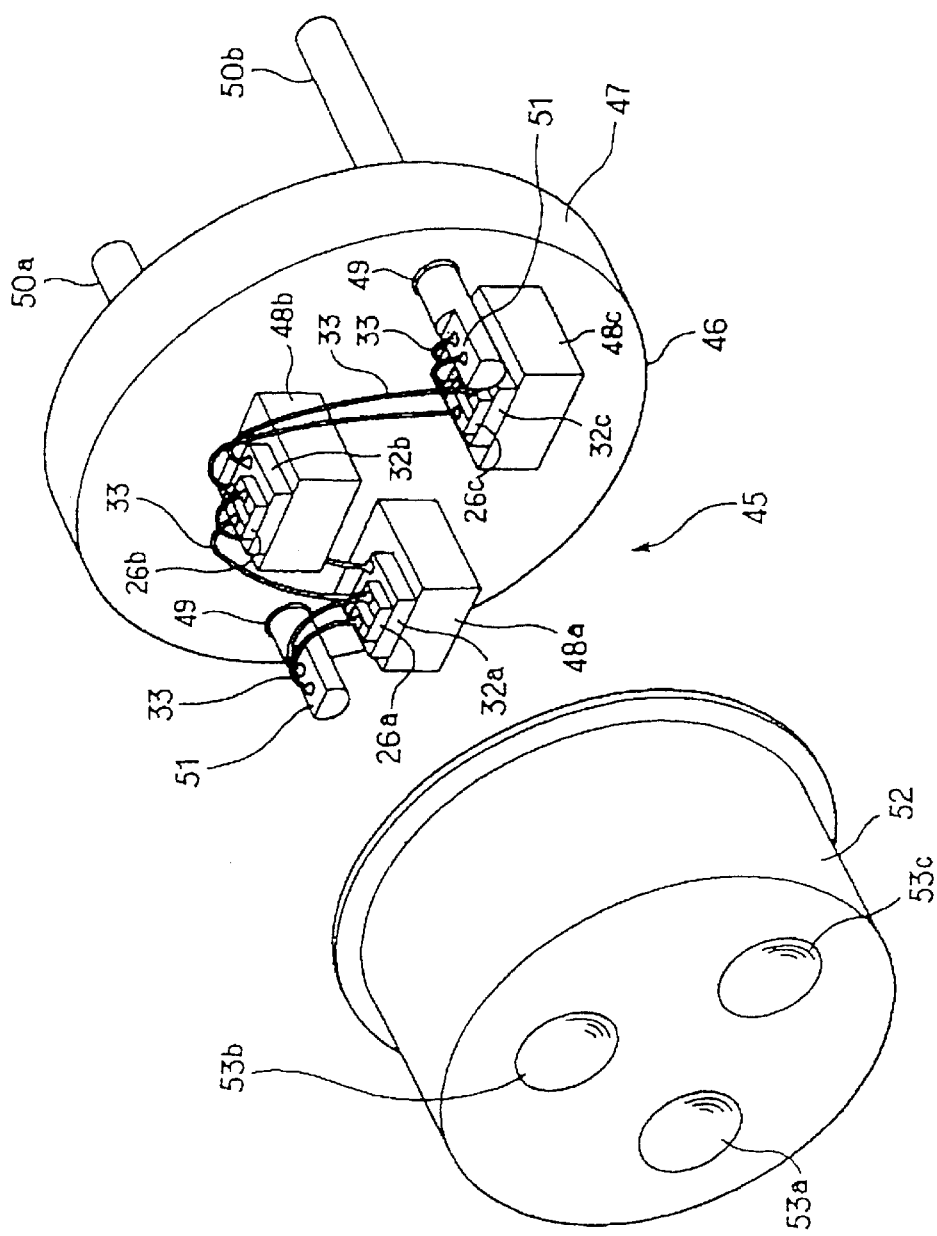
FIG. 15 is an exploded perspective view showing the internal structure of a semiconductor laser device according to a fourth embodiment of the present invention.

FIG. 15 shows the fourth embodiment of the present invention, and the difference between the first embodiment and the fourth embodiment lies in the use of a package 46, which can provide a light projector 45 as a semiconductor light projection apparatus having semiconductor laser devices 23a to 23c and each optical system combined. Here, the basic structure is the same as that of the first embodiment, but three metallic pedestals 48a to 48c are arranged and fixed to predetermined positions of a metallic base 47 to mount three semiconductor laser devices 26a to 26c thereon, and two lead terminals 50a and 50b are provided to be electrically insulated from this metallic base 47 through an insulator 49 made of glass or the like.

The semiconductor laser devices 26a to 26c are mounted and fixed to the metallic pedestals 48a to 48c through insulators 32a to 32c in the same way as mentioned above, respectively. Au wires 33 are respectively bonded between the respective electrodes two by two as illustrated in the figure to establish the series connection between the semiconductor laser devices 26a to 26c, and the electrodes positioned at both ends are bonded to each other between bonding surfaces 51 of lead terminals 50a and 50b by Au wires 33.

A case 52 has three windows corresponding to three semiconductor laser devices 26a to 26c, but lenses 53a to 53c for light projection are fitted thereto. These lenses 53a to 53c are subjected to the positional adjustment such that the laser beam output point portions of semiconductor laser devices 26a to 26c are positioned at their focal points, and the laser beams emitted from the respective lenses 53a to 53c are converted to parallel lights and collected at the light collection point P in a state where the case 52 is attached and sealed.

According to the above-mentioned fourth embodiment, the light projector 45 is structured by use of the package 46 for combining three semiconductor laser devices 26a to 26c and the lenses 53a to 53c as the optical system into one in addition to the effect of the first embodiment, making it possible to obtain the light projector 45 with a compact structure wherein all elements are combined into one, and making it simple to handle the light projector 45.

In the case of using such package 46, the position of the light collection point P cannot be changed after manufacture, but it is unnecessary to perform complicated adjustment of optical axis and positioning in the case of one in which the specification with respect to the light collection position is determined, and this makes it possible to sufficiently enjoy the merits in which the handing is simplified.

In consideration of the adjustment of optical axis and positioning, it is possible to provide the structure in which the optical system is formed separately. In this case, glass windows may be formed in place of lenses 53a to 53c.

Also, it is possible to the structure in which a diaphragm is provided such that interference of the laser beams from the respective laser device 26a to 26c does not occur. Moreover, it is possible to add the structure in which a monitor element is provided at the back of each of the semiconductor laser devices 26a to 26c so as to confirm the light-emitting condition.

Fifth Embodiment

Figure 16:
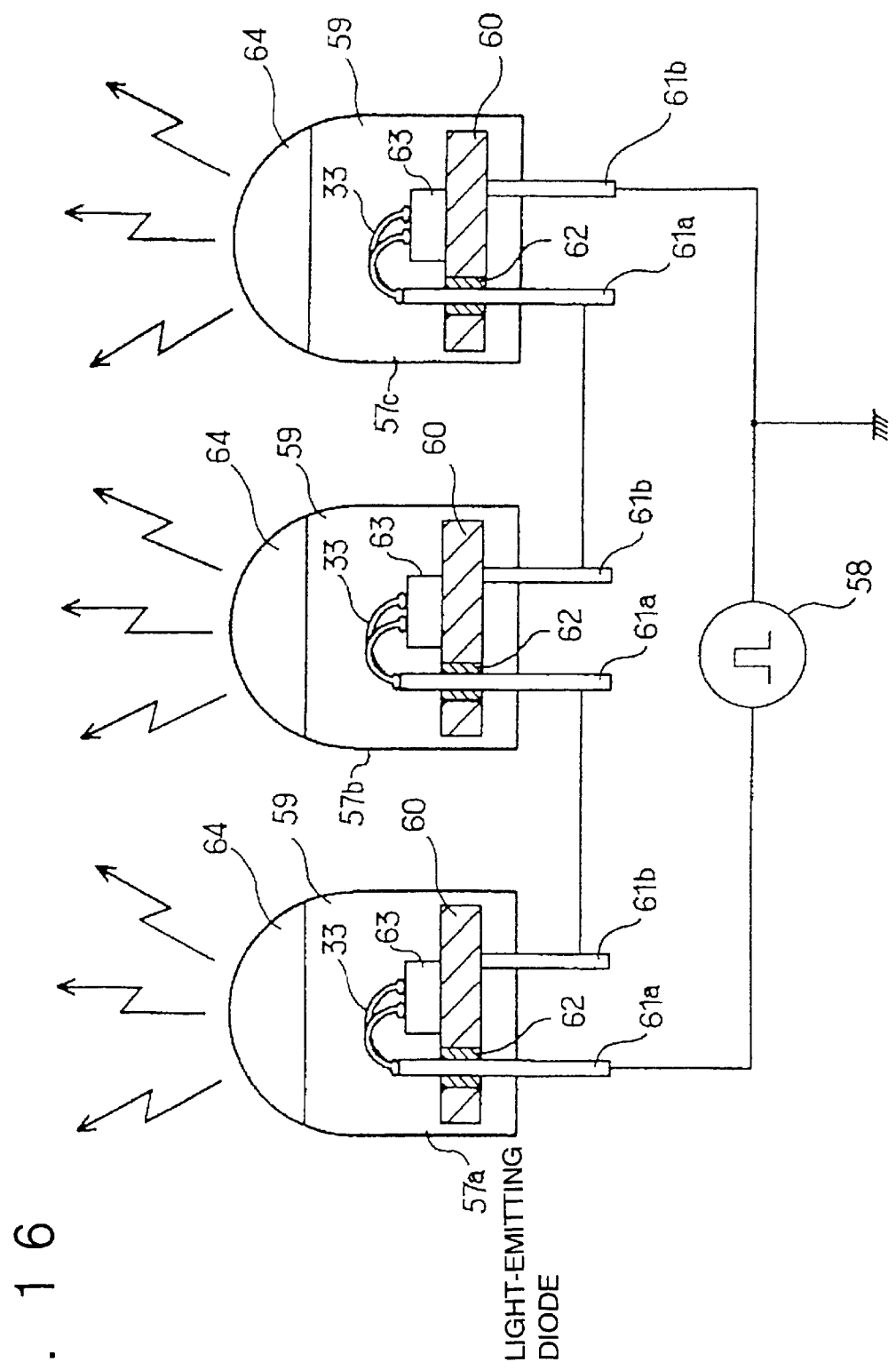
FIG. 16 is a schematic vertical longitudinal sectional view of the semiconductor laser device according to a fifth embodiment of the present invention.
Figure 17:
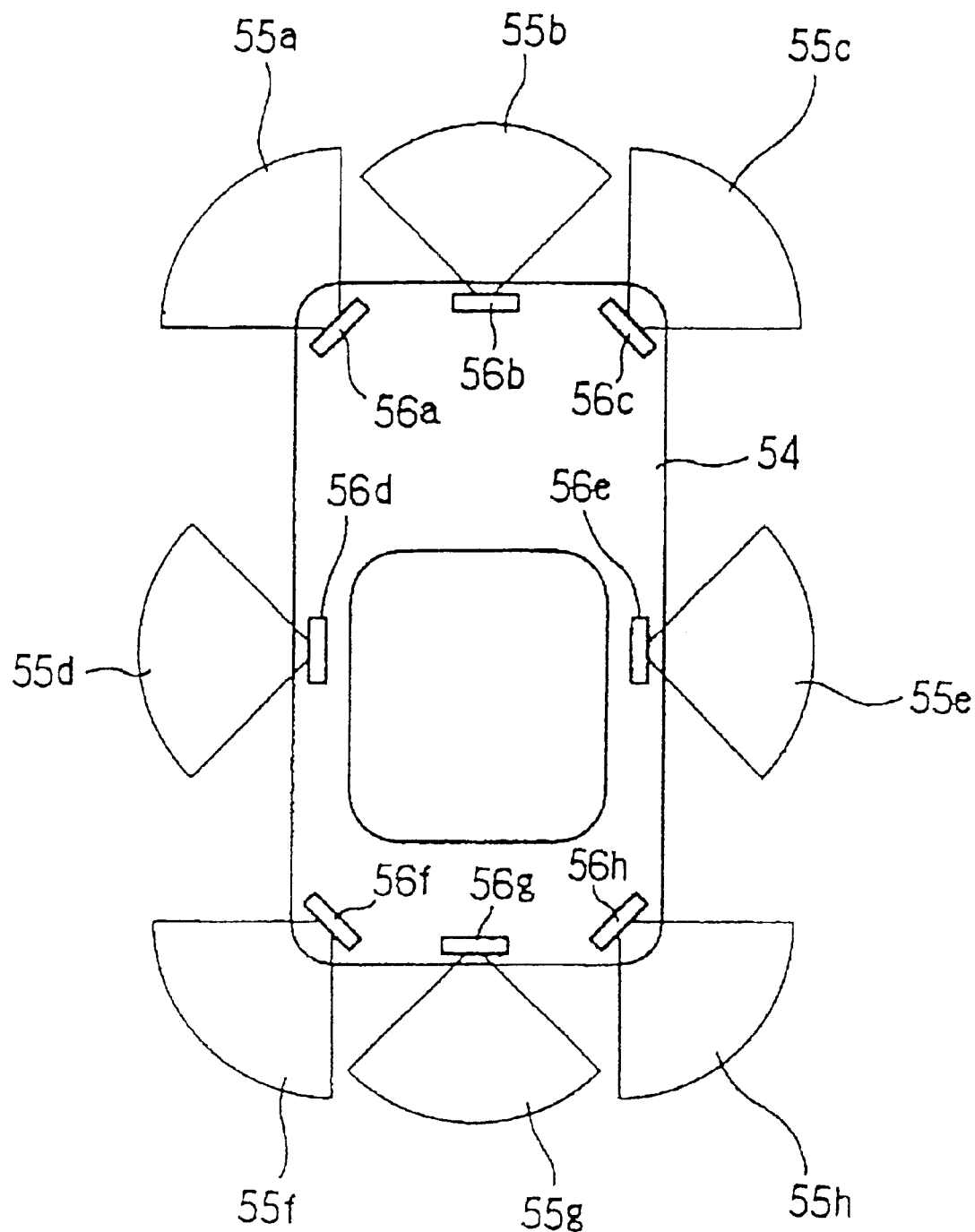
FIG. 17 is a view showing a state of arranging the distance measurement detecting apparatus according to the fifth embodiment of the present invention.

FIGS. 16 and 17 show the fifth embodiment of the present invention, and this will be explained as follows. This embodiment shows a distance measurement apparatus wherein a plurality of light-emitting diodes is in series connected to each other and lighted up, the light projections from the respective light-emitting diodes are performed in accordance with the respective light projection areas, and the distance of the object in the light projection areas relatively close to each other is detected.

Namely, as shown in FIG. 17, distance detectors 56a to 56h are respectively provided to the light projection areas around an automobile 54. The distance detectors 56a to 56h have light-emitting diode devices 57a to 57h as semiconductor light-emitting devices and photoreceptors (not shown), respectively, and they are structured to receive reflected light and detect the distance in the same way as the above.

Now, in this case, three light-emitting diode devices 57a to 57c arranged to be relatively close to each other are connected to a signal generating circuit 58 in a state where they are in series connected to each other, and these three light-emitting diode devices are lighted up by providing electric supply thereto from the signal generating circuit 58, simultaneously.

The respective light-emitting devices 57a to 57c are mounted on a package 59 similar to the general LED package, and two lead terminals 61 a and 61b are fixed to a metallic base 60. The lead terminal 61a is fixed to the metallic base 60 through an insulator 62, and the lead terminal 61b is fixed to the metallic base 60 to be electrically conducted thereto.

A diode device 63 is constituted by forming the multi-layer of expitaxial layers of GaAs/AlGaAs group on the n-type GaAs substrate, and is a face-emitting device. This diode device 63 is adhered and fixed to the metallic base 59 to be electrically conducted thereto, and Au wires 33 are bonded between the electrode formed on the surface side and the lead terminal 60a two by two to establish the electrical connection. The entirety is molded by translucent resin to constitute the package 59. A lens 64 is formed on the upper surface portion of the diode device 63 as one body by use of this translucent resin.

A set of light-emitting diode devices 57d and 57e and a set of light-emitting diode devices 57f to 57h are respectively driven and lighted up in a state where they are in series connected to each other in the same way as mentioned above. Also, the reason why all light-emitting diode devices 57a to 57h are not connected in series is to avoid increasing a wire harness caused by this and to reduce time and trouble required at the arranging time.

Three light-emitting diode devices 57a to 57c are simultaneously driven in series by adopting the above-mentioned structure, making it possible to perform the light operation corresponding to three light-emitting diode devices at an amount of current corresponding to one light-emitting diode device and to drive these light-emitting diode devices efficiently. Also, the above structure can be put to uses such as a case in which the detection of the object in each detection area is performed to prevent occurrence of a collision.

In this case, according to the result of the experiment conducted by the inventors, for example, the distance in the respective light projection areas 55a to 55h using the respective light-emitting diode devices 57a to 57h was detected to the extent of 10 m. Therefore, the above structure can be applied to a system wherein an alarm operation such as a lamp display is given to the user as recognizing that the object is approaching from the distance of about several meters, and an alarm, for example, is given to urge the user to use extreme caution in a case where the object is approaching to the extent of 30 cm and is in danger of collision.

In the aforementioned case, the number of light-emitting diode devices connected in series may be appropriately set, and the light projection area is not always limited to the area separated from the other area, and the overlapping area may be used.

Sixth Embodiment

FIGS. 18 to 24 show the sixth embodiment of the present invention, and the following will explain the portion different from that of the first embodiment. In a case where the outputs of the laser beams are enhanced so that the detection distance can be increased by the distance measurement apparatus in the automobile as in the first embodiment, there is a possibility that the laser beams are incident on the human eyes in consideration of the distance measurement environment. If the outputs of the laser beams are enhanced, this point must be sufficiently considered according to the enhancement. For this reason, the main purpose of this embodiment is to provide the distance measurement apparatus, which meets the safety standard even if the laser beams are incident on human eyes.

Also, in order to set the detection distance to be longer, it is needed that a light density be increased by irradiation of a plurality of laser beams to be overlapped with each other at the remote site efficiently. Moreover, the efficiency of the irradiation area largely varies depending on the spot shape of the laser beams and how the laser beams are arranged. This embodiment takes such a point into consideration, and provides the structure wherein the distance measurement operation can be performed efficiently and accurately as much as possible even if the spot at the light projection area of the laser beams is shaped elliptical.

Figure 18:
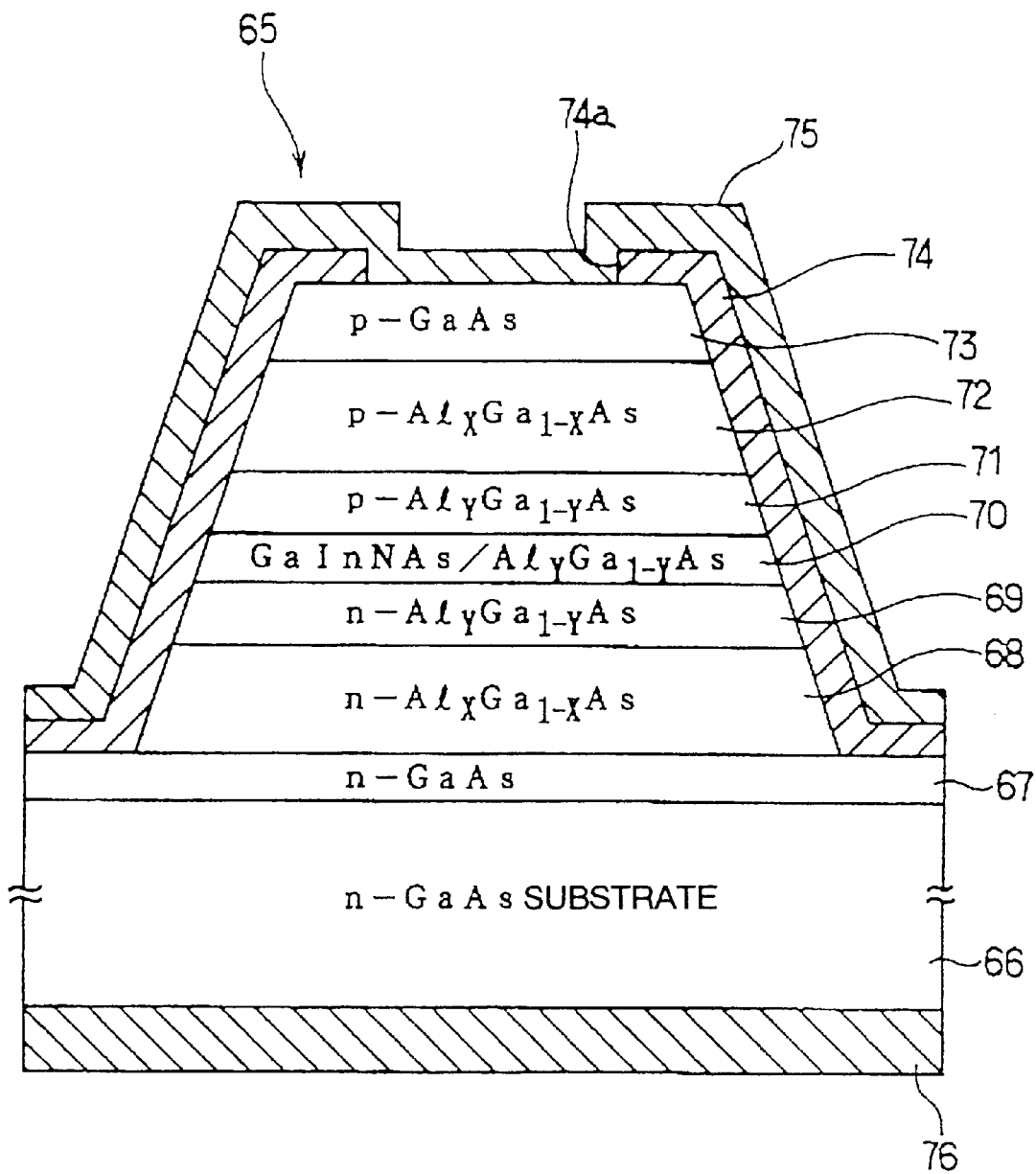
FIG. 18 is a schematic sectional view of the semiconductor laser device according to a sixth embodiment of the present invention.

FIG. 18 schematically shows a cross-sectional structure of a semiconductor laser device 65 mounted onto the interior of each of the semiconductor laser devices 23a to 23c, and the material, which has been briefly explained as the modification in the explanation of the first embodiment, is used. Namely, the semiconductor laser device 65 is formed of the material of GaAs—GaInNAs group. Hereinafter, one, which is formed of the material of this group, will be explained. However, as described later, a material of InP—GaInPAs group can be used as a material, which meets the condition of eye safety.

The respective semiconductor layers set forth below are sequentially layered on a n-GaAs (GaAs of n-type conductivity) substrate 66, which is the semiconductor substrate. First of all, a buffer layer 67, made of an n-GaAs layer having a film thickness of about 0.1 $\mu$m is layered on the GaAs substrate 66, a clad layer 68, made of an n-Al$_x$Ga$_{1-x}$As layer having a film thickness of 0.5 to 1.0 $\mu$m, is layered thereon, and an optical guide layer 69, made of an n-Al$_y$Ga$_{1-y}$As layer having a film thickness of 0.1 to 1.0 $\mu$m, is layered thereon. The composition ratio between x and y in each of the clad layer 68 and the optical layer 69 is set to obtain a refractive index, which is necessary for exerting the function by each layer.

An active layer 70 is layered on the optical guide layer 69. The active layer 70 is formed to have a multiple quantum well structure by alternately stacking a plurality of layers (2 to 10 layers) including GaInNAs layers each having a film thickness of 5 to 20 nm and AlGaAs layers each having a film thickness of 5 to 20 nm. In this case, the layer conditions such as the GaInNAs layer, AlGaAs layer, and the number of layers, or the setting condition of the composition ratio of the respective layers are selected, whereby making it possible to set an equivalent band gap energy Eg and to change a laser emission wavelength by the active layer 70.

In the case of the wavelength of 1.4 $\mu$m or more, which is the condition for the eye safe laser, the composition ratio of GaInNAs layer is set to Ga$_{0.57}$In$_{0.13}$N$_{0.04}$As$_{0.96}$, whereby obtaining an emission wavelength of 1.45 $\mu$m. The AlGaAs layer constituting the active layer 70 is set to have the composition ratio, which is the same as that of the AlGaAs layer constituting the optical layer 69 or the composition ratio in which the value of the band gap energy Eg is smaller than that of the optical layer 69.

Figure 20:
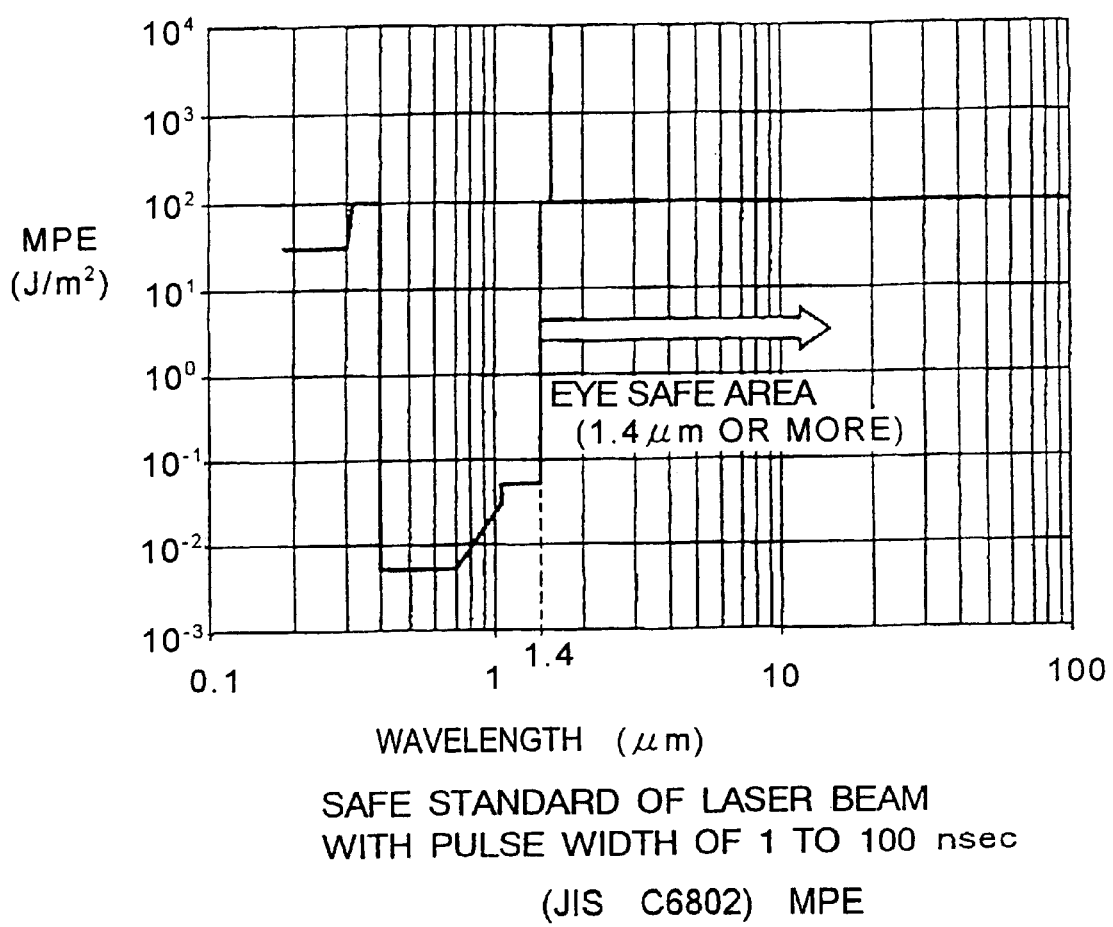
FIG. 20 is a view showing the relationship between a light-emitting wavelength of a laser beam with a pulse width of 1 to 100 nm and a safe standard MPE according to the sixth embodiment of the present invention.
Figure 22:
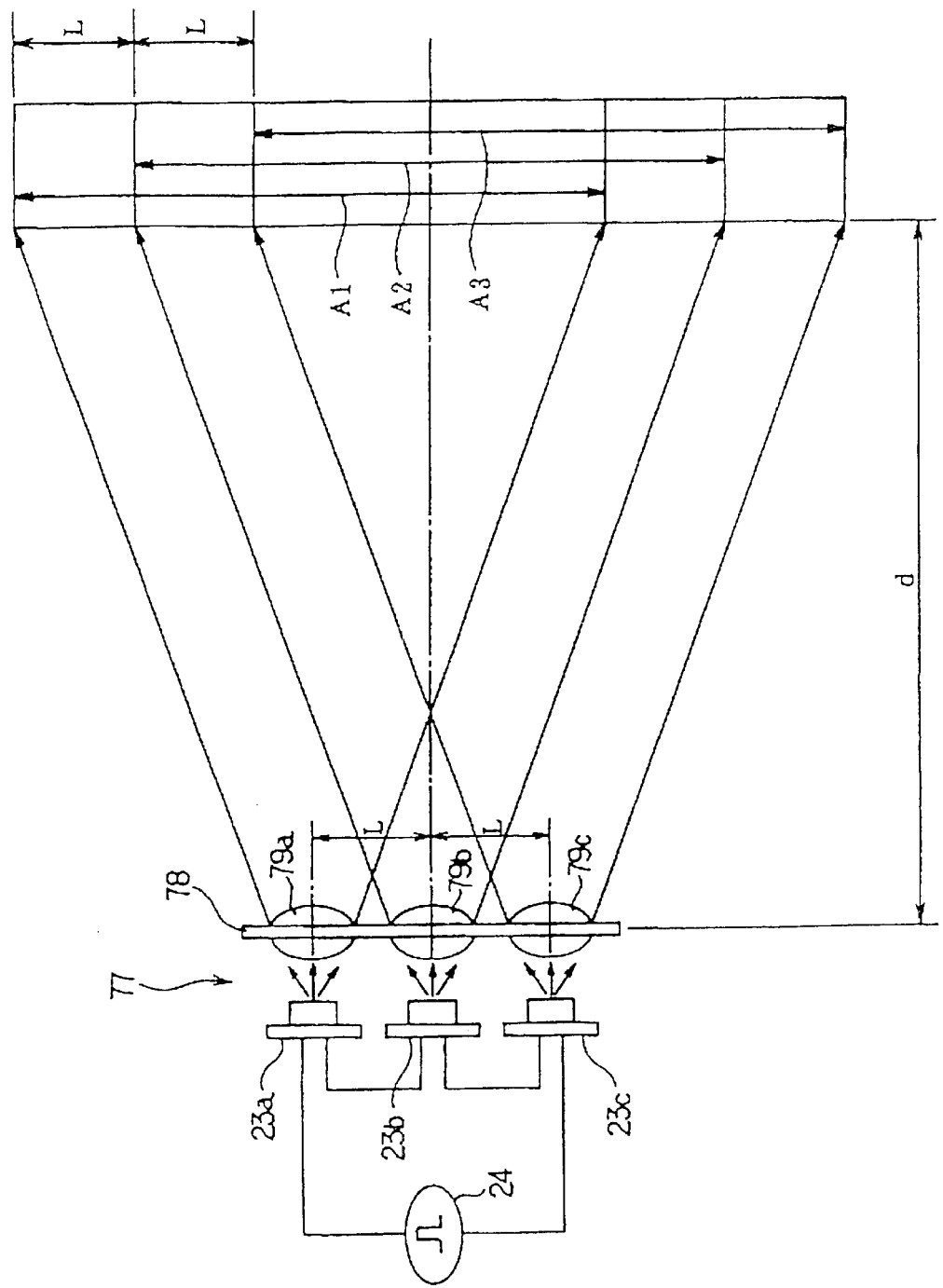
FIG. 22 is a view showing the relationship between a light projector arranging state and a beam spot projecting state according to the sixth embodiment of the present invention.

The wavelength of 1.4 $\mu$m or more, which is the condition for the eye safe laser, was obtained on the basis of the following standard. The safety standard of the laser beam with exposure time (pulse width) of 1 to 100 ns is extracted from data of a safety standard MPE, which is shown by JIS-C6802 as illustrated in FIG. 21, and the relationship between the MPE and the wavelength is shown by FIG. 20. From FIG. 20, it can be seen that the wavelength of 1.4 $\mu$m or more is a condition in which an exposure quantity, which is orders of magnitude greater, is permitted with respect to the light on the wavelength shorter than that, and a condition in which an adverse influence is little exerted upon the human eyes.

It should be noted that the active layer 70 can use a double heterojunction structure wherein the GaInNAs layer is formed to have a single layer structure with a film thickness of about 20 to 100 nm in a case where no quantum well structure is adopted. In the case of the single layer structure, the thicker the film thick, the better the efficiency of light-emission. However, if the thickness thereof increases more than the above value, the single layer structure is impractical since the influence of resistance components is greatly exerted thereon.

On the active layer 70, a p-$Al_yGa_{1-y}As$ layer having a film thickness of 0.1 to 1.0 µm is layered as an optical guide layer 71, and an $Al_xGa_{1-x}As$ layer having a film thickness of 0.5 to 1.0 µm is layered as a clad layer 72. And, a p-GaAs layer having a film thickness of 0.3 to 0.5 µm is layered thereon as a cap layer 73. Then, the semiconductor layers 68 to 73, which include the abovementioned clad layer 68 and which are placed at the upper position than the clad layer 68, are mesa-shaped in the horizontal direction in the figure as a whole, and are shaped in a stripe form in the direction perpendicular to the cross-sectional view illustrated.

An insulation film 74 such as $SiO_2$ and the like is formed on the surface of such a mesa-shaped portion. At the upper surface of the cap layer 73, an aperture 74*a* having a predetermined stripe width (more than 100 µm, e.g., width size of 400 µm) is formed on the insulation film 74, and a p-type electrode 75 is coated over the upper surface of the cap layer 73*a* and the front surface thereof. Also, an n-type electrode 76 is coated on the back surface (lower side) of the n-GaAs substrate 66. The material of each of the p-type electrode 75 and the n-type electrode 76 is the same as that of the above-mentioned case, and an ohmic contact with each of the cap layer 73 and the n-GaAs substrate 66 is formed.

Regarding the method of forming the aforementioned semiconductor laser device 65, the manufacturing steps as those of the first embodiment are used, and the explanation is omitted.

Next, a brief explanation is given of the advantage relating to the use of material of the GaInNAs group, which outputs the laser beam with the wavelength of the aforementioned eye safe area. FIGS. 19A and 19B are band diagrams of the materials of the GaInNAs group and the GaInPAs group. Here, a case of the composition radio of wavelength of 1.3 µm is shown as an example. Regarding the wavelength band of the eye safe laser, the composition ratio is slightly changed, but the same effect as mentioned above can be basically obtained.

In the semiconductor layer using the GaInNAs as an active layer, the value of wavelength is not limited to 1.4 µm, and the light-emitting wavelength can be widely changed up to about 1.8 µm by changing the composition of N. Since this structure employs the material of GaAs, which is often used as a substrate in the semiconductor laser conventionally, not many special steps are used in the device manufacturing process, thereby bringing about a advantage of the simplification of the process.

Then, as shown in FIG. 19A, seeing from the difference in the energy of the handoff set generated at the junction portion between the GaInNAs area and the AlGaAs area, an energy difference $\Delta Ec$ (=570 meV) of a conduction band is large as compared with an energy difference $\Delta Ev$ (=60 meV) of a valence band. This means that the effect of shutting electrons in the GaInAs area, serving as a well layer, increases so that the electrons can be sufficiently shut in the active layer 70 on the basis of this energy difference $\Delta Ec$ even in a high temperature operating state.

Therefore, both the electrons and the holes are shut in the light-emitting area of GaInNAs without fail so that characteristic temperature To can be improved up to an ideal value of the semiconductor laser and light-emitting operation can be performed efficiently. Whereby, the self-heating of the device at the time of operating the devices at a large amount of outputs and the reduction in optical outputs at the same current can be almost eliminated so that a stable operation can be performed. Particularly, this is very useful for the case assuming the object such as an automobile is used under the environment where a temperature difference changes radically.

Now, the above-formed semiconductor laser device 65 of the same is mounted onto each of three semiconductor laser devices 23*a* to 23*c*. Next, an explanation is given of a light projector 77 as a semiconductor light projection apparatus on which these semiconductor laser devices 23*a* to 23*c* are mounted with reference to FIG. 22.

The light projector 77 is provided such that three semiconductor laser devices 23*a* to 23*c* are arranged to be positioned on one a straight line with a predetermined distance L (for example, L=5 to 15 mm). At this time, the respective semiconductor laser devices 23*a* to 23*c* are disposed in a state in which the direction of the active layer 70 of the semiconductor laser device 65 is orthogonal to the linear direction where the semiconductor laser devices 23*a* to 23*c* are arranged. This is because the beam spot is elliptically shaped at the projection area, thereby bringing about the feature in the arrangement as described later.

These three semiconductor laser devices 23*a* to 23*c* have the electrical structure in which they are connected in series to the signal generating circuit 24, which is a power supply, in the same manner as mentioned above. The light projection lenses 79*a* to 79*c*, which are held by a lens holder 78 as one body, and which serve as an optical apparatus, are provided to the semiconductor laser elements 23*a* to 23*c*, respectively. As shown in the figure, these projection lenses 79*a* to 79*c* project lights of the respective semiconductor laser devices 23*a* to 23*c* to be spread at a fixed widening angle, and the directions of their optical axes are set to be parallel to each other.

Therefore, as shown in the figure, if the laser beams are projected to the position with a distance d from the respective semiconductor laser devices 23*a* to 23*c* through the light projection lenses 79*a* to 79*c*, the respective beam spots A1 to A3 are projected in a state where they are shifted by L. Then, the shift quantity of beam spots A1 to A3 is always constant regardless of the distance d. This brings about the structure in which the light density is not reduced at the time of measuring a long distance to be described later.

Moreover, in general, the beam spots projected by use of the semiconductor laser device are elliptically shaped. In the vicinity of the light-emitting section, the elliptical shape expands in a width direction of the beam emitting section of the active layer 70. From the position a little away, the elliptical shape whose longer diameter is oriented to the direction orthogonal to the active layer 70. Then, this beam spot is reduced to a predetermined widening angle by the light projection lenses 79*a* to 79*c*, and projected. Namely, in a condition that these beam spots are projected, the elliptical shapes of the respective beam spots are formed in a state in which their longer diameters are oriented to the vertical direction and they are shifted by distance L. The elliptical shape of this beam spot is set such that the size in the vertical direction, that is, a longer diameter a is about 2.5 times to 4 times longer than the size in the horizontal direction, that is, a shorter diameter b.

Regarding the projection pattern of the light projector 77, if the widening angle is set to, for example, 1°, the length size a in the vertical direction is about 17 cm at the distance of 10 m, the length size c in the horizontal direction of the area where three projection area are overlapped with each other is 15 cm since the upper and lower portions are respectively lessened by L in the case where three semiconductor laser devices 23a to 23c are used as shown in this example. Therefore, a degree that the projection areas are overlapped with each other in this case is about 88%. The length size a in the vertical direction is about 87 cm at the distance of 50 m, the length size c in the horizontal direction of the overlapping areas is 85 cm. Therefore, a degree of the overlapping degree that the projection areas are overlapped with each other in this case is greatly increased, that is, more than 97%. Namely, from this point, it is shown that the overlapping area widens with an increase in distance d.

In a case where the projecting distance is short, the light density is still so high that the distance measurement can be sufficiently performed even with the light quantity of one semiconductor laser device even if the degree of the overlapping of the projection areas is relatively small. Then, the longer the projecting distance, the more the degree of the overlapping of the projection areas contrary to the fact the light density reduces, so that the distance measurement can be sufficiently performed with the light quantities of three semiconductor laser devices, and the measurement of up to the long distance can be performed accurately.

Figure 23:
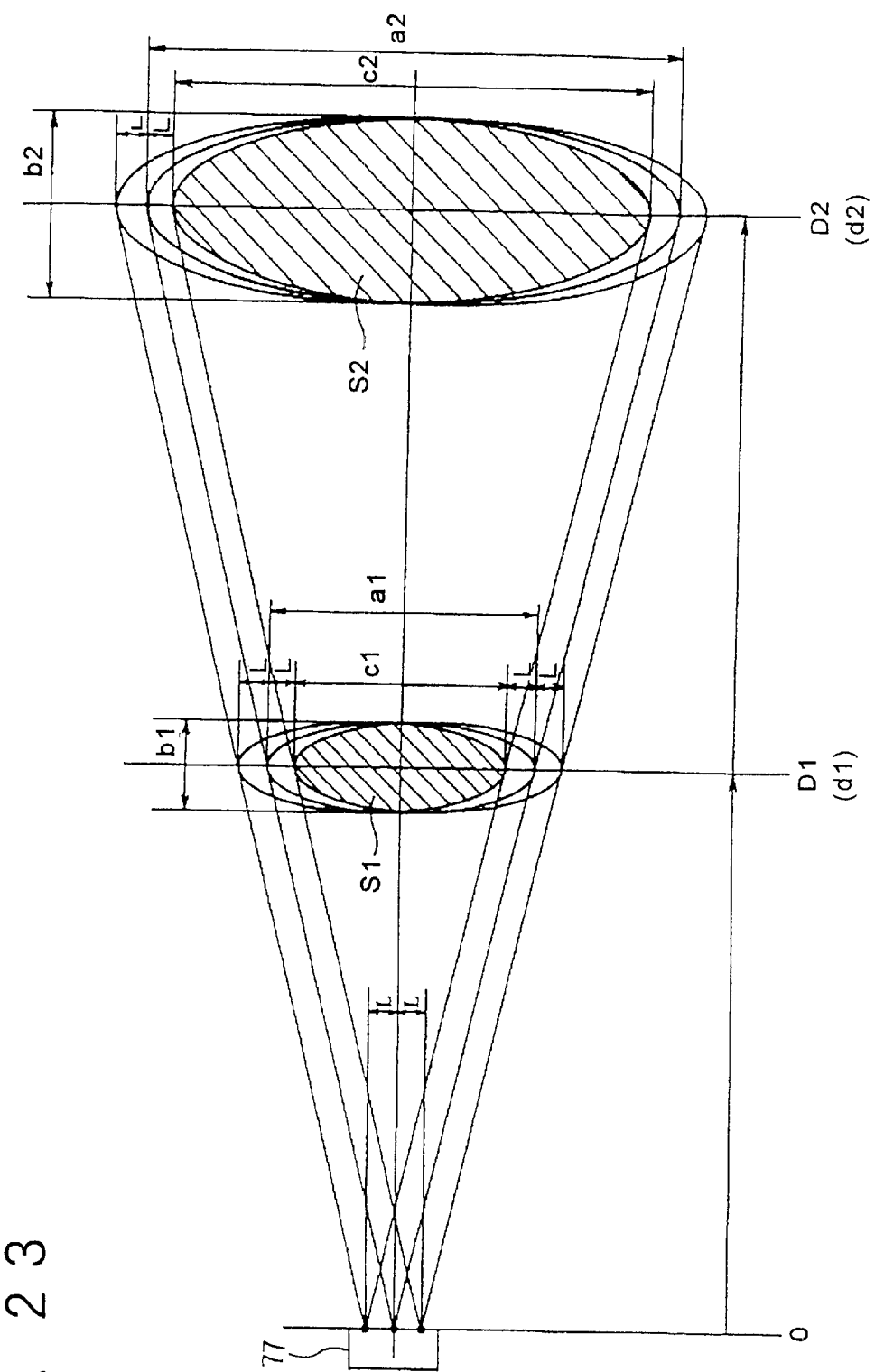
FIG. 23 is a view explaining the relationship between the projected light distance of the semiconductor laser device and the overlapping according to the sixth embodiment of the present invention.

The aforementioned relationship is generalized and shown by FIG. 23.

More specifically, in connection with the measuring points D1 and D2 where the distances from the light projector 77 are d1, d2 (d2>d1), the degree of the overlapping areas of the projection areas is calculated. Though the number of semiconductor laser devices is 3 in the state illustrated, it is assumed that the number of semiconductor laser devices is n. Suppose that the size a in the vertical direction corresponding to the elliptical longer diameter is k times longer than the size b in the horizontal direction corresponding to the shorter diameter (a=kb), and that the size a in the vertical direction at unit distance do is ao.

First of all, the size a1 in the vertical direction of the beam spot at the measuring point D1 is given as in equation (1), and the size c1 of the portion where the projection areas are overlapped with other is given as in equation (2). If degree r1 of the overlapping portion is calculated from these values, the following equation (3) can be obtained.

$$a1 = d1 \cdot ao \quad (1)$$

$$c1 = a1 - L(n-1) \quad (2)$$

$$r1 = c1/a1$$

$$= 1 - L(n-1)/a1$$

$$= 1 - L(n-1)/(d1 \cdot ao) \quad (3)$$

Next, if each of values a2, c2, r2 at the measuring point D2 are obtained in a like manner, the following equations (4) to (6) can be given.

$$a2 = d2 \cdot ao \quad (4)$$

$$c2 = a2 - L(n-1) \quad (5)$$

$$r2 = c2/a2$$

$$= 1 - L(n-1)/a2$$

$$= 1 - L(n-1)/(d2 \cdot ao) \quad (6)$$

As a result, it can be understood that the value is increased by lessening the value to be reduced from 1 of the right side of equation (6) at the measuring point D1 of distance d2. From the above result, it can be understood that the reduction in the distance L of the semiconductor laser device and the decrease in the number thereof contribute to the increase in the value of the degree r of the overlapping portion.

Then, since there is no shift with respect to the horizontal direction, it is clear that the degree of the overlapping portion in a projection area S2 in the case of distance d2 than a projection area S1 in the case of distance d1 as compared with the elliptical area of the beam spot.

Figure 24:
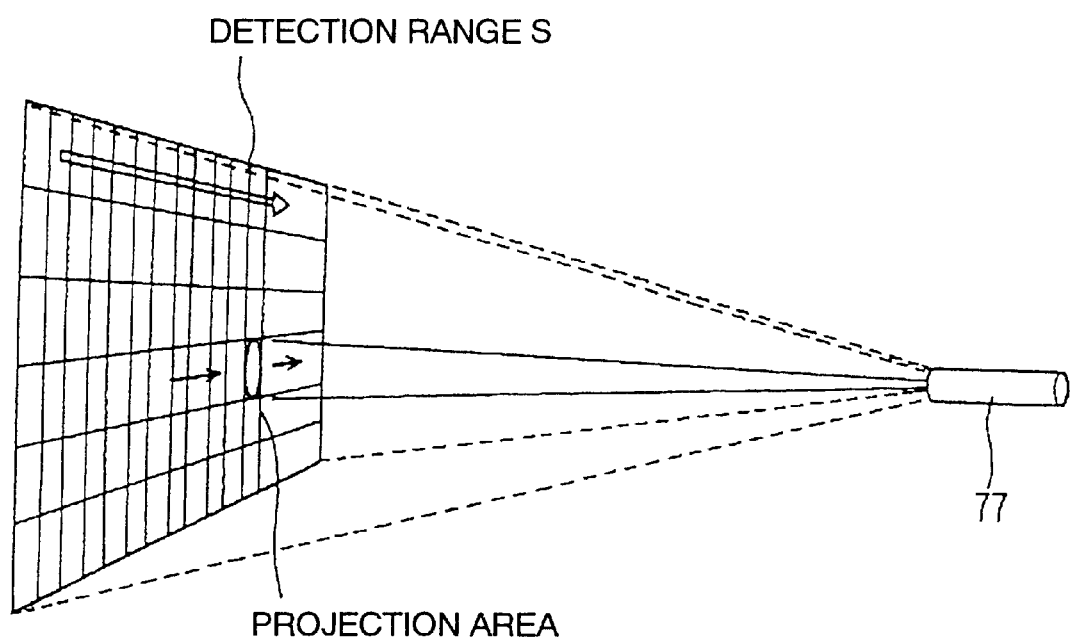
FIG. 24 is a view showing a detection range where laser beams are scanned according to the sixth embodiment of the present invention.
Figure 25:
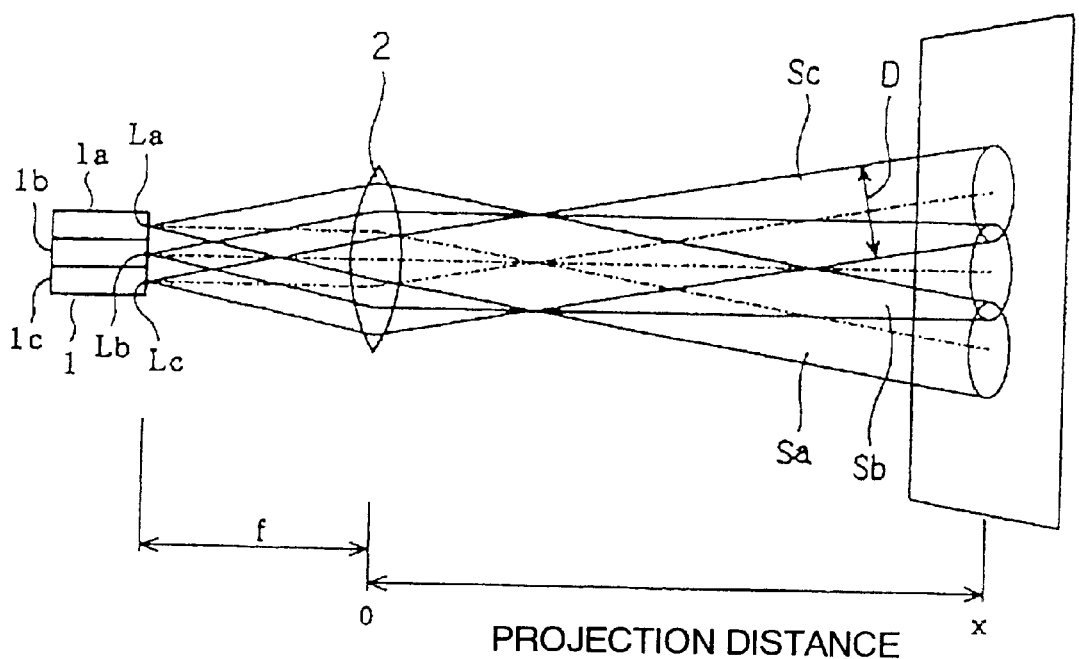
FIG. 25 is a view explaining an amount of shifts of the spots of laser beams according to the prior art (short distance)
Figure 26:
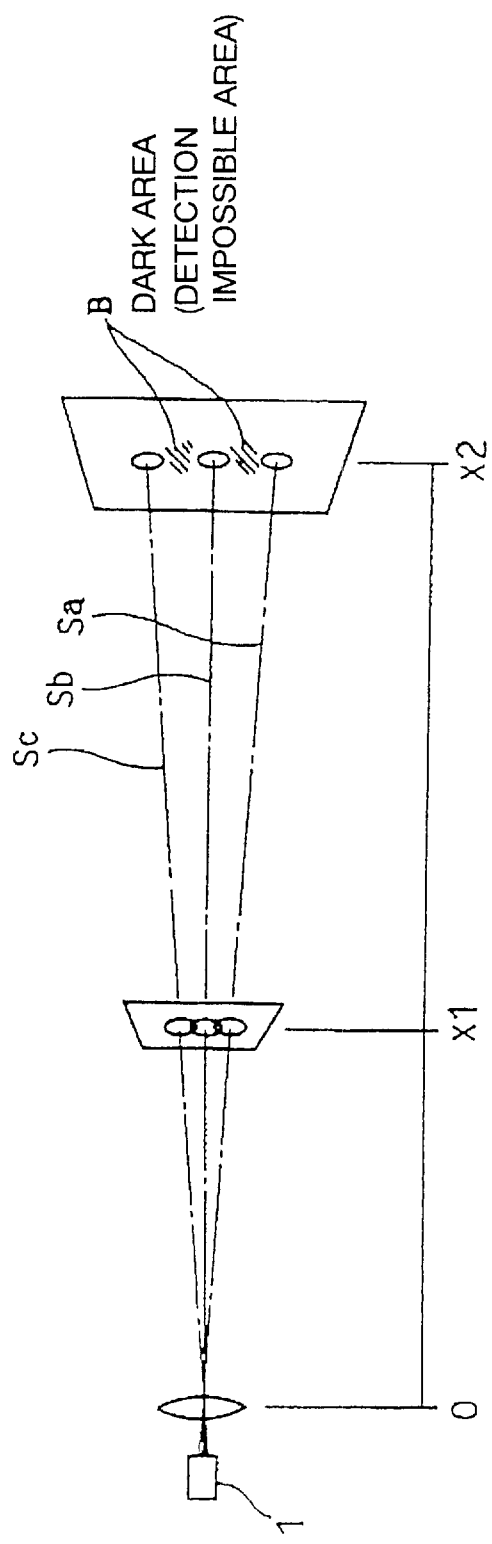
FIG. 26 is a view explaining an amount of shifts of the spots of laser beams according to the prior art (long distance).

Next, an explanation is given of another advantage wherein the elliptical shapes of the beam spots are thus arranged such that their longer diameters are oriented to the vertical direction. FIG. 24 shows a state of the projection performed by the light projector 77, and this corresponds to one shown in FIG. 8 in the first embodiment. The case of FIG. 8 is explained assuming that the beam spot is circular, however, in this embodiment, the beam spot is set such that its longer diameter is oriented to the vertical direction, so that the expand of the beams to the horizontal direction can be used in a state that it is the narrowest.

This makes it possible to obtain a large number of measuring points, which can be detected such that the beam spots are prevented from entering the adjacent areas at one scanning in the horizontal direction, and to enhance resolution of detection. In the case of one that runs on the road such as an automobile, the detailed detection of the distribution state of the distance detection in the horizontal direction is useful for the reason of the point that a running course and the like is precisely set as compared with the detailed detection of the distribution state of the distance detection in the vertical direction, and this embodiment meets such a purpose.

According to the sixth embodiment, since the semiconductor Iser device 64 is formed of a material of GaAs—GaInNAs group and the light-emitting wavelength is set to be more than 1.4 μm, the safety standard can be sufficiently satisfied even if it is used under an environment having a possibility that the laser beams are incident on the human eyes, and the light intensity can be enhanced and output at the time of measuring the long distance.

Also, in the light projector 77, the semiconductor laser devices 23a to 23c are arranged such that the optical axes are parallel to each other and equally spaced in the same plane, and the elliptical shapes are shifted and overlapped with each other in the direction of the longer diameter. As a result, the degree of the overlapping of the beam spots from the respective laser devices can be enhanced as the irradiation of beams is given to more remote point, and the measurement of the remote distance can be efficiently performed.

Moreover, since the elliptical shapes of the beam spots to the projection areas due to the light projector 77 are set such that their longer diameters are arranged in the vertical direction with respect to the ground, resolution of the detection with respect to the horizontal scanning can be increased. This makes it possible to efficiently measure the direction to the direction of travel of the automobile and the distance.

Other Embodiments

The present invention is not limited to the aforementioned embodiments and the following modification or expansion can be performed.

As a semiconductor light-emitting device, an EL device (electroluminescence device) and the like may be used.

The shape of the lead terminal and that of the bonding surface are not limited to those described in the abovementioned embodiments, and they can be appropriately changed if the structure having the flat surface is provided.

It is possible to provide the structure wherein monitor devices are incorporated into the semiconductor laser devices 23a to 23c. For example, in the first embodiment, it is possible to provide the structure wherein monitor devices such as photodiodes for detecting that the semiconductor laser device 26 is emitted is incorporated into the package 27 to detect the laser beams leaked in the direction opposite to the laser beam emitting direction of the semiconductor laser device 26. Whereby, even if the malfunction due to a short-circuiting occurs and the outputs of the laser beams is stopped, the state can be detected from the output detected by the monitor devices, making it possible to easily recognize that the state is left standing and the laser beam outputs are reduced as a whole.

The number of semiconductor laser devices is not limited to three, and two or four or more may be provided as required. Moreover, the use of the semiconductor laser devices is not limited to the case in which all semiconductor laser devices 23a to 23c are used to collect lights, and some of them is used to collect the lights and other semiconductor laser devices may be singly used without collecting lights.

The above explained the case in which scanning was two-dimensionally performed in the range of the detecting object by use of the light projector 13. However, the structure in which the scanning is one-dimensionally performed may be provided.

The above explained the case in which the semiconductor light projector apparatus was applied to the distance measurement apparatus. However, the present invention is limited to such a case, and the present invention can be used in such an apparatus that detects the object interrupting the light in a state where the light projection is performed by the semiconductor light projection apparatus. Whereby, the present invention can be applied to a security system, which detects an illegal intruder and issues an alarm.

Also, as the moving object on which the distance measurement apparatus is mounted, moving objects such as a motorcycle, an electric train, and the like other than the automobile, and moving objects such as a helicopter, a plane, and the like. Moreover, the distance measurement apparatus can be mounted on a carrying vehicle, which moves on track or non-track without human intervention, or a moving robot.

The light projection area to be detected can be provided such that the measurement can be performed with respect to not only the direction of travel of the moving object but also right and left directions and the back.

Also, the distance measurement apparatus can be mounted on a building or a robot without limiting to the moving object such as an automobile.

In the structure of the semiconductor laser device 65 of the sixth embodiment, the structure in which the optical guide layers 69 and 71 were provided was explained. However, it is possible to structure the semiconductor laser device 65 to be directly interposed between clad layers.

Even in a case where the semiconductor laser device 65 using the material of the GaInNAs group or that of the GaInPAs group is employed, the semiconductor laser device 65 can be structured such that the wavelength is set to 1.4 μm or less, which is the eye safe value. In this case, the semiconductor laser device 65 is used in the state that the output is lowered or under the environment having no possibility that the laser beams are incident on the human eyes in the case of high output, thereby eliminating the problem of eye safety.

The semiconductor laser devices 23a to 23c as light projector 77 are arranged on one straight line at equal intervals, and the light projection lenses 79a to 79c are arranged such that the elliptical shapes of the projecting beam spots are overlapped with each other in a state that they are shifted by the distance L in the direction of the longer diameter, whereby the optical axes are adjusted. As a result, the degree of the overlapping of the projection areas can be enhanced as the remote distance increases, and the light projection can be performed efficiently by the measurement of the long distance, and the accuracy in detection can be improved.

Moreover, since the direction of the beam spots projected by the light projector 77 is set such that the longer diameters of the elliptical shapes are arranged in the vertical direction with respect to the ground, resolution of the detection in the horizontal direction can be increased. This can be effectively used as the measurement condition in the case where the distance measurement apparatus applied to the automobile.

The sixth embodiment explained the case in which the relationship relating to the arrangement of three semiconductor laser devices was set in a case where the beam spots were elliptically shaped at the light projection area due to the semiconductor laser devices. However, in the case of adjusting the beam spots to be circular by a contrivance of the optical system, the condition of arrangement relating to the semiconductor laser devices is set such that the semiconductor laser devices are placed at the top of a regular triangle as in the first embodiment, whereby the same effect as that of the first embodiment can be expected.

Although the preferred embodiments of the present invention have been described in detail, it should be understood that various changes, substitutions and alternations can be made therein without departing from spirit and scope of the inventions as defined by the appended claims.

What is claimed is:

1. A semiconductor light projecting apparatus comprising:
   a plurality of light emitting devices connected in series, each of which is a current-driven type two terminal device; and
   a plurality of optical devices that correspond to said plurality of light-emitting devices, said plurality of optical devices guiding light emitted from said plurality of light emitting devices to a predetermined light projection area,
   wherein a power supply path is provided for a power source, said power supply path supplying power to said plurality of light emitting devices;
   wherein said plurality of light emitting devices includes:
   a plurality of semiconductor chips;
   a metallic base;
   a plurality of metallic pedestals for loading said plurality of semiconductor chips, said plurality of metallic pedestals provided in said metallic base so as to correspond to said plurality of semiconductor light emitting devices; and
   at least two terminals provided so as to correspond to both terminals when said plurality of semiconductor chips are in series connected to each other, and
   wherein said plurality of semiconductor chips are in series connected to each other by bonding wires in a state where said plurality of semiconductor chips are loaded on said plurality of metallic pedestals and fixed thereto.

2. The semiconductor light projecting apparatus according to claim 1, wherein said plurality of semiconductor light emitting devices include a cover with which a lens corresponding to a light projection of each of said plurality of semiconductor chips is integrally formed.

3. A semiconductor light projecting apparatus comprising:
- a plurality of semiconductor light emitting devices connected in series, each including a semiconductor laser chip designed so as to emit light having a wavelength of 1.4 μm or more; and
- a plurality of optical devices that correspond to said plurality of semiconductor light emitting devices, said plurality of optical devices guiding light emitted from each of said semiconductor light emitting devices to a predetermined light projection area,
- wherein a power supply path is provided for a power source, said power supply path supplying power to said semiconductor light emitting devices.

4. A semiconductor light projecting apparatus comprising:
- a plurality of light emitting devices connected in series, each including a light emitting diode chip designed so as to emit light having a wavelength of 1.4 μm or more; and
- a plurality of optical devices that correspond to said plurality of light emitting devices, said plurality of optical devices guiding light emitted from each of said plurality of light emitting devices to a predetermined light projection area,
- wherein a power supply path is provided for a power source, said power supply path supplying power to said plurality of light emitting devices.

5. A semiconductor light projecting apparatus comprising:
- a plurality of light emitting devices connected in series; and
- a plurality of optical devices that correspond to said plurality of light emitting devices, said plurality of optical devices guiding light emitted from each of said plurality of light emitting devices to a predetermined light projection area,
- wherein a power supply path is provided for a power source, said power supply path supplying power to said plurality of light emitting devices;
- wherein optical axes of said plurality of optical devices are adjusted so that light emitted from said each of said plurality of light emitting devices is collected and projected to overlap on one light projection area.

6. The semiconductor light projecting apparatus according to claim 5, wherein when spots of light emitted from said plurality of light emitting devices in a light projection area assume an ellipsoidal shape, said plurality of optical devices are disposed so that optical axes thereof are arranged in parallel and at equal intervals on said same plane, and said plurality of light emitting devices are disposed so that said spots in said light projection area create shifts in a major axis direction of said ellipsoidal shape and overlap each other.

7. A distance measurement apparatus comprising:
- a semiconductor light projecting apparatus including:
  - a plurality of light emitting devices connected in series; and
  - a plurality of optical devices that correspond to said plurality of light emitting devices, said plurality of optical devices guiding light emitted from each of said plurality of light emitting devices to a predetermined light projection area,
  - wherein a power supply path is provided for a power source, said power supply path supplying power to said plurality of light emitting devices;
  - wherein optical axes of said plurality of optical devices are adjusted so that said light emitted from said each of said plurality of light emitting devices is collected and projected to overlap on one light projection area;
- light receiving means for receiving reflected light from an object existing in said one light projection area of said semiconductor light projecting apparatus; and
- detection means for measuring a time from light projection by said semiconductor light projecting apparatus to reception of said reflected light, thus detecting a distance to said object existing in said light projection area.

8. The distance measurement apparatus according to claim 7, wherein said detection means controls said semiconductor light projecting apparatus so as to allow said semiconductor light projecting apparatus to perform pulse lighting.

9. The distance measurement apparatus according to claim 8, wherein optical axes of said plurality of optical devices are adjusted so that a light collection point where lights emitted from said plurality of semiconductor light emitting devices are collected is positioned within a range of a detection distance.

10. The distance measurement apparatus according to claim 9, wherein a position of the light collection point set by said optical devices is adjusted to a remotest point within the range of said detection distance.

11. The distance measurement apparatus according to claim 9, wherein a position of the light collection point set by said optical devices is adjusted to a middle point within the range of said detection distance.

12. The distance measurement apparatus according to claim 8, wherein light projection scanning means for scanning a projected direction of the light emitted from said semiconductor light projection apparatus is provided, and said detection means detects a distance when said light projection scanning means scans the light projected areas of said semiconductor light projecting apparatus, thus detecting the distance so as to correspond the respective light projected areas scanned.

13. The distance measurement apparatus according to claim 12, wherein said light projection scanning means is constituted so as to scan the projection direction of the light emitted from said semiconductor light projection apparatus two-dimensionally.

14. The distance measurement apparatus according to claim 7, wherein the distance measurement apparatus is loaded on a moving body, and detects a distance within a light projected area existing in a running direction of the moving body.

15. The distance measurement apparatus according to claim 14, wherein said moving body is an automobile.

16. The distance measurement apparatus according to claim 14, wherein when spots of lights emitted from said semiconductor light emitting devices in the light projected area assume an ellipsoidal shape, the spot of light emitted by the semiconductor light projection apparatus is set so that a major axis direction of the ellipsoidal shape is arranged in a perpendicular direction to a road surface.

17. The distance measurement apparatus of claim 7, wherein a degree in which said light emitted from said each of said plurality of light emitting devices overlaps increases as a projection distance increases.

18. A distance measurement apparatus mounted on a moving body for detecting a distance between said distance measurement apparatus and each of a plurality of light projecting areas set around said moving body, said distance measurement apparatus comprising:

a semiconductor light projecting apparatus including a plurality of light emitting devices, and a plurality of optical devices that correspond to said plurality of light emitting devices, said plurality of optical devices guiding light emitted from said plurality of light emitting devices to said plurality of light projection areas, wherein:

a power supply path is provided for a power source, said power supply path supplying power to said plurality of light emitting devices in series; and optical axes of said plurality of optical devices are adjusted so that said light emitted from said plurality of light emitting devices is collected and projected onto said plurality of light projection areas;

a plurality of light receiving means for receiving reflected light from an object existing in said light projection areas of said semiconductor light projecting apparatus; and detection means for measuring a time from light projection by said semiconductor light projecting apparatus to reception of said reflected light to thereby detect a distance to said object existing in said plurality of light projection areas.

19. The distance measurement apparatus according to claim 18, wherein said moving body is an automobile.

* * * * *